US009542877B2

(12) United States Patent
Park et al.

(10) Patent No.: US 9,542,877 B2
(45) Date of Patent: Jan. 10, 2017

(54) ELECTROLUMINESCENT DISPLAY AND METHOD OF DRIVING THE SAME

(71) Applicant: Samsung Display Co., Ltd., Yongin, Gyeonggi-Do (KR)

(72) Inventors: Su-Hyeong Park, Gyeongju-si (KR); Ji-Myoung Seo, Hwaseong-si (KR); Hee-Soon Jeong, Hwaseong-si (KR); Soo-Wan Yoon, Hwaseong-si (KR); Ji-Woong Jeong, Yongin-si (KR); Jun-Woo Hong, Cheonan-si (KR); Joon-Chul Goh, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 63 days.

(21) Appl. No.: 14/699,933

(22) Filed: Apr. 29, 2015

(65) Prior Publication Data

US 2016/0180763 A1 Jun. 23, 2016

(30) Foreign Application Priority Data

Dec. 22, 2014 (KR) .................. 10-2014-0186050

(51) Int. Cl.
*G09G 5/10* (2006.01)
*G09G 3/20* (2006.01)
(Continued)

(52) U.S. Cl.
CPC .......... *G09G 3/2018* (2013.01); *G09G 3/2003* (2013.01); *G09G 3/3233* (2013.01);
(Continued)

(58) Field of Classification Search
USPC ..... 345/690, 691, 76, 77, 87, 206, 205, 212; 348/294
See application file for complete search history.

(56) References Cited

U.S. PATENT DOCUMENTS

| 8,164,663 B2 * | 4/2012 | Pain ..................... H04N 3/1568 348/294 |
| 2004/0090402 A1 * | 5/2004 | Cheng .................... G09G 3/30 345/77 |

(Continued)

FOREIGN PATENT DOCUMENTS

| EP | 2 610 843 A2 | 7/2013 |
| KR | 10-0894606 B1 | 4/2009 |

(Continued)

OTHER PUBLICATIONS

Partial European Search Report dated Dec. 10, 2015 for European Patent Application No. EP 15 183 093.2, which corresponds to subject U.S. Appl. No. 14/699,933, and cites the above-identified references numbered 1-3.

*Primary Examiner* — Thuy Pardo
(74) *Attorney, Agent, or Firm* — Knobbe Martens Olson & Bear LLP

(57) ABSTRACT

An electroluminescent display and a method of driving the same are disclosed. In one aspect, the display includes a display panel including a plurality of pixels configured to operate based on a first power supply voltage having a negative voltage level. The display panel is configured to generate at least one feedback voltage corresponding to an ohmic drop of the first power supply voltage. An analog-to-digital converter is configured to generate at least one digital feedback signal based on the at least one feedback voltage. An adaptive voltage controller is configured to generate a voltage control signal based on input image data, the at least one digital feedback signal, a distribution of the input image data and the ohmic drop of the first power supply voltage. A voltage converter is configured to generate the first power supply voltage based on an input voltage and the voltage control signal.

20 Claims, 17 Drawing Sheets

(51) Int. Cl.
*H01L 27/32* (2006.01)
*G09G 3/32* (2016.01)

(52) U.S. Cl.
CPC ....... *G09G 3/3258* (2013.01); *H01L 27/3276* (2013.01); *G09G 2300/0426* (2013.01); *G09G 2300/0819* (2013.01); *G09G 2310/027* (2013.01); *G09G 2310/08* (2013.01); *G09G 2320/0626* (2013.01); *G09G 2330/021* (2013.01); *G09G 2330/028* (2013.01); *G09G 2360/16* (2013.01)

(56) References Cited

U.S. PATENT DOCUMENTS

| | | | |
|---|---|---|---|
| 2007/0085784 A1* | 4/2007 | Liu | G09G 3/30 345/77 |
| 2008/0055298 A1* | 3/2008 | Chung | G09G 3/2014 345/205 |
| 2008/0158109 A1* | 7/2008 | Chung | G09G 3/3233 345/76 |
| 2009/0027375 A1 | 1/2009 | Ryu et al. | |
| 2009/0273546 A1* | 11/2009 | Kim | G09G 3/3233 345/76 |
| 2010/0238149 A1* | 9/2010 | Kishi | G09G 3/3233 345/206 |
| 2011/0249045 A1* | 10/2011 | Liu | G09G 3/30 345/690 |
| 2013/0009939 A1 | 1/2013 | Ebisuno et al. | |
| 2013/0278587 A1* | 10/2013 | Kawano | G09G 3/3233 345/212 |
| 2014/0210874 A1* | 7/2014 | Cheng | G09G 3/30 345/691 |
| 2016/0125805 A1* | 5/2016 | Yamashita | G09G 3/3233 345/690 |

FOREIGN PATENT DOCUMENTS

| | | |
|---|---|---|
| KR | 10-2011-0123983 A | 11/2011 |
| KR | 10-2012-0114989 A | 10/2012 |
| KR | 10-2014-0028860 A | 3/2014 |

* cited by examiner

ELECTROLUMINESCENT DISPLAY AND METHOD OF DRIVING THE SAME

INCORPORATION BY REFERENCE TO ANY PRIORITY APPLICATIONS

This application claims priority under 35 U.S.C. §119 to Korean Patent Application No. 10-2014-0186050 filed on Dec. 22, 2014, in the Korean Intellectual Property Office (KIPO), the disclosure of which is hereby incorporated by reference herein in its entirety.

BACKGROUND

Field

The described technology generally relates to an electroluminescent display and a method of driving the electroluminescent display.

Description of the Related Technology

Various display devices such as liquid crystal displays (LCDs), plasma displays, and electroluminescent displays have gained popularity. Among these, the electroluminescent display can be driven with quick response speed and reduced power consumption, using a matrix of light-emitting diodes (LEDs) or an organic light-emitting diodes (OLEDs) that emit light through recombination of electrons and holes. Each OLED includes an anode electrode, a cathode electrode and a light-emitting layer between the two electrodes, and the light-emitting layer is formed of material that emits light depending on a driving current flowing through the light-emitting layer from the anode electrode to the cathode electrode. The luminance of the electroluminescent display is determined by the driving currents of the OLEDs in the respective pixels. Thus, higher driving currents are required as the displayed image has increased brightness.

SUMMARY OF CERTAIN INVENTIVE ASPECTS

One inventive aspect relates to an electroluminescent display that can adaptively control a low power supply voltage having a negative voltage level.

Another aspect is a method of driving an electroluminescent display that can adaptively control a low power supply voltage having a negative voltage level.

Another aspect is an electroluminescent display that includes a display panel, an analog-to-digital converter, an adaptive voltage controller and a voltage converter. The display panel includes a plurality of pixels that operate based on a low power supply voltage of a negative voltage level. The analog-to-digital converter generates at least one digital feedback signal based on at least one feedback voltage for detecting an ohmic drop of the low power supply voltage. The adaptive voltage controller generates a voltage control signal based on input image data and the digital feedback signal such that the voltage control signal is varied depending on a distribution of the input image data and the ohmic drop of the low power supply voltage. The voltage converter generates the low power supply voltage based on an input voltage and the voltage control signal.

The adaptive voltage controller can adjust the voltage control signal such that the low power supply voltage is maintained at a target voltage where the target voltage is higher than a reference voltage by a sum of a grayscale margin and an ohmic drop margin. The grayscale margin can be varied depending on a maximum grayscale of the input image data and the ohmic drop margin can be varied depending on the ohmic drop of the low power supply voltage.

The grayscale margin can decrease as the maximum grayscale of the input image data increases.

The ohmic drop margin can decrease as the ohmic drop of the low power supply voltage increases.

The electroluminescent display can further includes a plurality of conduction lines respectively connected to a plurality of detection points on a cathode electrode included in the display panel. The at least one feedback voltage can include a plurality of feedback voltages that are provided to the analog-to digital converter through the conduction lines, respectively.

The ohmic drop of the low power supply voltage can correspond to a difference between a maximum feedback voltage among the plurality of feedback voltages and the low power supply voltage applied to the display panel.

The adaptive voltage controller can include a first voltage calculator configured to generate a first target voltage signal indicating a first target voltage based on the input image data where the first target voltage is varied depending on a maximum grayscale of the input image data, an ohmic drop detector configured to provide a measured ohmic drop margin based on the digital feedback signal where the measured ohmic drop margin is varied depending on the ohmic drop of the low power supply voltage, a second voltage calculator configured to generate a second target voltage signal indicating a second target voltage based on the first target voltage signal and the measured ohmic drop margin where the second target voltage is higher than the first target voltage by the measured ohmic drop margin and a control signal generator configured to generate the voltage control signal based on the second target voltage signal.

The input image data can include red data, green data and blue data. The first voltage calculator can extract a maximum grayscale of the red data, a maximum grayscale of the green data and a maximum grayscale of the blue data to determine the first target voltage.

The ohmic drop detector can include a maximum feedback voltage extracting unit configured to extract and provide a maximum feedback voltage based on a plurality of digital feedback signals respectively corresponding to a plurality of feedback voltages, a first calculating unit configured to provide a measured ohmic drop based on the maximum feedback voltage and the voltage control signal, a second calculating unit configured to provide a maximum ohmic drop based on the first target voltage signal and a third calculating unit configured to provide the measured ohmic drop margin based on the measured ohmic drop and the maximum ohmic drop.

The measured ohmic drop margin can correspond to a difference between the maximum ohmic drop and the measured ohmic drop.

The adaptive voltage controller can adjust the voltage control signal such that the low power supply voltage decreases stepwise by a first voltage interval per frame period when the low power supply voltage is higher than the second target voltage and the low power supply voltage increases stepwise by a second voltage interval per frame period when the low power supply voltage is lower than the second target voltage.

The first voltage interval can be set to be greater than the second voltage interval.

The adaptive voltage controller can include a first voltage calculator configured to generate a first target voltage signal indicating a first target voltage based on the input image data where the first target voltage is varied depending on a maximum grayscale of the input image data, an ohmic drop detector configured to provide a measured ohmic drop margin based on the digital feedback signal where the measured ohmic drop margin is varied depending on the ohmic drop of the low power supply voltage, an ohmic drop calculator configured to provide a calculated ohmic drop margin based on the input image data where the calculated ohmic drop margin is varied depending on an average grayscale of the input image data, a second voltage calculator configured to generate a second target voltage signal indicating a second target voltage based on the first target voltage signal, the measured ohmic drop margin and the calculated ohmic drop margin where the second target voltage is higher than the first target voltage by a smaller margin among the measured ohmic drop margin and the calculated ohmic drop margin, and a control signal generator configured to generate the voltage control signal based on the second target voltage signal.

The ohmic drop calculator can include an average grayscale calculating unit configured to provide average grayscales of red data, green data and blue data included in the input image data, a first calculating unit configured to provide a calculated ohmic drop based on the average grayscales and a second calculating unit configured to provide the calculated ohmic drop margin based on a maximum ohmic drop and the calculated ohmic drop.

The calculated ohmic drop margin can correspond to a difference between the maximum ohmic drop and the calculated ohmic drop.

The input image data can be provided by unit of frame. The adaptive voltage controller can generate the voltage control signal that is determined based on the input image data of an (N−1)-th frame while the display panel displays an image of the input image data of an N-th frame where N is an integer equal to or greater than 2.

The electroluminescent display can further include a frame memory configured to store the input image data by unit of frame. The input image data can be provided by unit of frame. The adaptive voltage controller can generate the voltage control signal that is determined based on the input image data of an M-th frame while the display panel displays an image of the input image data of the M-th frame where M is an integer equal to or greater than 1.

The electroluminescent display can further include a data correction unit configured to correct grayscales of the input image data to provide corrected image data. The adaptive voltage controller can generate the voltage control signal based on the corrected image data instead of the input image data.

Another aspect is a method of driving an electroluminescent display, that includes providing at least one feedback voltage for detecting an ohmic drop of a low power supply voltage of a negative voltage level from a display panel including a plurality of pixels that operate based on the low power supply voltage, generating a digital feedback signal based on the feedback voltage, generating a voltage control signal based on input image data and the digital feedback signal such that the voltage control signal is varied depending on a distribution of the input image data and the ohmic drop of the low power supply voltage, and generating the low power supply voltage based on an input voltage and the voltage control signal.

Generating the voltage control signal can include generating a first target voltage signal indicating a first target voltage based on the input image data where the first target voltage is varied depending on a maximum grayscale of the input image data, providing a measured ohmic drop margin based on the digital feedback signal wherein the measured ohmic drop margin is varied depending on the ohmic drop of the low power supply voltage, generating a second target voltage signal indicating a second target voltage based on the first target voltage signal and the measured ohmic drop margin wherein the second target voltage is higher than the first target voltage by the measured ohmic drop margin and generating the voltage control signal based on the second target voltage signal.

Another aspect is an electroluminescent display comprising a display panel including a plurality of pixels configured to operate based on a first power supply voltage having a negative voltage level, wherein the display panel is configured to generate at least one feedback voltage corresponding to an ohmic drop of the first power supply voltage. The display also comprises an analog-to-digital converter configured to generate at least one digital feedback signal based on the at least one feedback voltage and an adaptive voltage controller configured to generate a voltage control signal based on input image data, the at least one digital feedback signal, a distribution of the input image data and the ohmic drop of the first power supply voltage. The display also comprises a voltage converter configured to generate the first power supply voltage based on an input voltage and the voltage control signal.

In the above electroluminescent display, the adaptive voltage controller is further configured to adjust the voltage control signal so as to maintain the first power supply voltage at a target voltage, wherein the target voltage is greater than a reference voltage by the sum of a grayscale margin and an ohmic drop margin, and wherein the adaptive voltage controller is further configured to determine the grayscale margin based on a maximum grayscale of the input image data, and wherein the adaptive voltage controller is further configured to generate the ohmic drop margin based on the ohmic drop of the first power supply voltage.

In the above electroluminescent display, adaptive voltage controller is further configured to decrease the grayscale margin as the maximum grayscale of the input image data increases.

In the above electroluminescent display, the adaptive voltage controller is further configured to decrease the ohmic drop margin as the ohmic drop of the first power supply voltage increases.

The above electroluminescent display further comprises a plurality of conduction lines electrically connected to a plurality of detection points, respectively, wherein the conduction lines are formed over a cathode electrode included in the display panel, wherein the display panel is further configured to transmit the at least one feedback voltage including a plurality of feedback voltages, of the at least one feedback voltage, to the analog-to digital converter through the conduction lines.

In the above electroluminescent display, the ohmic drop of the first power supply voltage corresponds to the difference between a maximum feedback voltage of the feedback voltages and the first power supply voltage.

In the above electroluminescent display, the adaptive voltage controller includes: a first voltage calculator configured to generate a first target voltage signal corresponding to a first target voltage based on the input image data and a maximum grayscale of the input image data; an ohmic drop detector configured to provide a measured ohmic drop margin based on the digital feedback signal and the ohmic drop of the first power supply voltage; a second voltage calculator configured to generate a second target voltage signal corresponding to a second target voltage based on the first target voltage signal and the measured ohmic drop margin, wherein the second target voltage is greater than the first target voltage by the measured ohmic drop margin; and a control signal generator configured to generate the voltage control signal based on the second target voltage signal.

In the above electroluminescent display, the input image data includes red data, green data and blue data, wherein the first voltage calculator is further configured to extract a maximum grayscale of the red data, a maximum grayscale of the green data and a maximum grayscale of the blue data so as to determine the first target voltage.

In the above electroluminescent display, the at least one feedback voltage comprises a plurality of feedback voltages that include a maximum feedback voltage, wherein the ohmic drop detector includes: a maximum feedback voltage extractor configured to extract and provide a maximum feedback voltage based on a plurality of digital feedback signals respectively corresponding to the feedback voltages; a first calculator configured to provide a measured ohmic drop based on the maximum feedback voltage and the voltage control signal; a second calculator configured to provide a maximum ohmic drop based on the first target voltage signal; and a third calculator configured to provide the measured ohmic drop margin based on the measured ohmic drop and the maximum ohmic drop.

In the above electroluminescent display, the measured ohmic drop margin corresponds to the difference between the maximum ohmic drop and the measured ohmic drop.

In the above electroluminescent display, the adaptive voltage controller is further configured to adjust the voltage control signal so as to i) decrease the first power supply voltage substantially stepwise by a first voltage interval per frame period when the first power supply voltage is greater than the second target voltage and ii) increase the first power supply voltage substantially stepwise by a second voltage interval per frame period when the first power supply voltage is less than the second target voltage.

In the above electroluminescent display, the first voltage interval is greater than the second voltage interval.

In the above electroluminescent display, the adaptive voltage controller includes: a first voltage calculator configured to generate a first target voltage signal corresponding to a first target voltage based on the input image data and a maximum grayscale of the input image data; an ohmic drop detector configured to provide a measured ohmic drop margin based on the digital feedback signal and the ohmic drop of the first power supply voltage; an ohmic drop calculator configured to provide a calculated ohmic drop margin based on the input image data and an average grayscale of the input image data; a second voltage calculator configured to generate a second target voltage signal corresponding to a second target voltage based on the first target voltage signal, the measured ohmic drop margin and the calculated ohmic drop margin, wherein the second target voltage is greater than the first target voltage by a smaller value of the measured ohmic drop margin and the calculated ohmic drop margin; and a control signal generator configured to generate the voltage control signal based on the second target voltage signal.

In the above electroluminescent display, the ohmic drop calculator includes: an average grayscale calculator configured to provide average grayscales of red data, green data and blue data included in the input image data; a first calculator configured to provide a calculated ohmic drop based on the average grayscales; and a second calculator configured to provide the calculated ohmic drop margin based on a maximum ohmic drop and the calculated ohmic drop.

In the above electroluminescent display, the calculated ohmic drop margin corresponds to the difference between the maximum ohmic drop and the calculated ohmic drop.

In the above electroluminescent display, the input image data is in units of frames, wherein the adaptive voltage controller is further configured to generate the voltage control signal based on the input image data of an (N−1)-th frame while the display panel displays an image of the input image data of an N-th frame, where N is an integer equal to or greater than 2.

The above electroluminescent display further comprises a frame memory configured to store the input image data in units of frames, wherein the input image data is in units of frames, and wherein the adaptive voltage controller is further configured to generate the voltage control signal based on the input image data of an M-th frame while the display panel displays an image of the input image data of the M-th frame, where M is an integer equal to or greater than 1.

The above electroluminescent display further comprises a data corrector configured to correct grayscales of the input image data so as to provide corrected image data, wherein the adaptive voltage controller is further configured to generate the voltage control signal based on the corrected image data instead of the input image data.

Another aspect is a method of driving an electroluminescent display, comprising: providing at least one feedback voltage configured to detect an ohmic drop of a first power supply voltage having a negative voltage level from a display panel, wherein the display panel includes a plurality of pixels configured to operate based on the first power supply voltage; generating a digital feedback signal based on the at least one feedback voltage; generating a voltage control signal based on input image data, the digital feedback signal, wherein the voltage control signal varies depending on a distribution of the input image data and the ohmic drop of the first power supply voltage; and generating the first power supply voltage based on an input voltage and the voltage control signal.

In the above method, generating the voltage control signal includes: generating a first target voltage signal corresponding to a first target voltage based on the input image data and a maximum grayscale of the input image data; providing a measured ohmic drop margin based on the digital feedback signal and the ohmic drop of the first power supply voltage; generating a second target voltage signal corresponding to a second target voltage based on the first target voltage signal and the measured ohmic drop margin, wherein the second target voltage is greater than the first target voltage by the measured ohmic drop margin; and generating the voltage control signal based on the second target voltage signal.

According to at least one of the disclosed embodiments, the electroluminescent display and the method of driving the electroluminescent display reduce power consumption with suppressing degradation of display quality, by detecting the ohmic drop of the low power supply voltage using the feedback voltage and controlling the low power supply voltage based on the detected ohmic drop.

DETAILED DESCRIPTION OF CERTAIN INVENTIVE EMBODIMENTS

Figure 1:
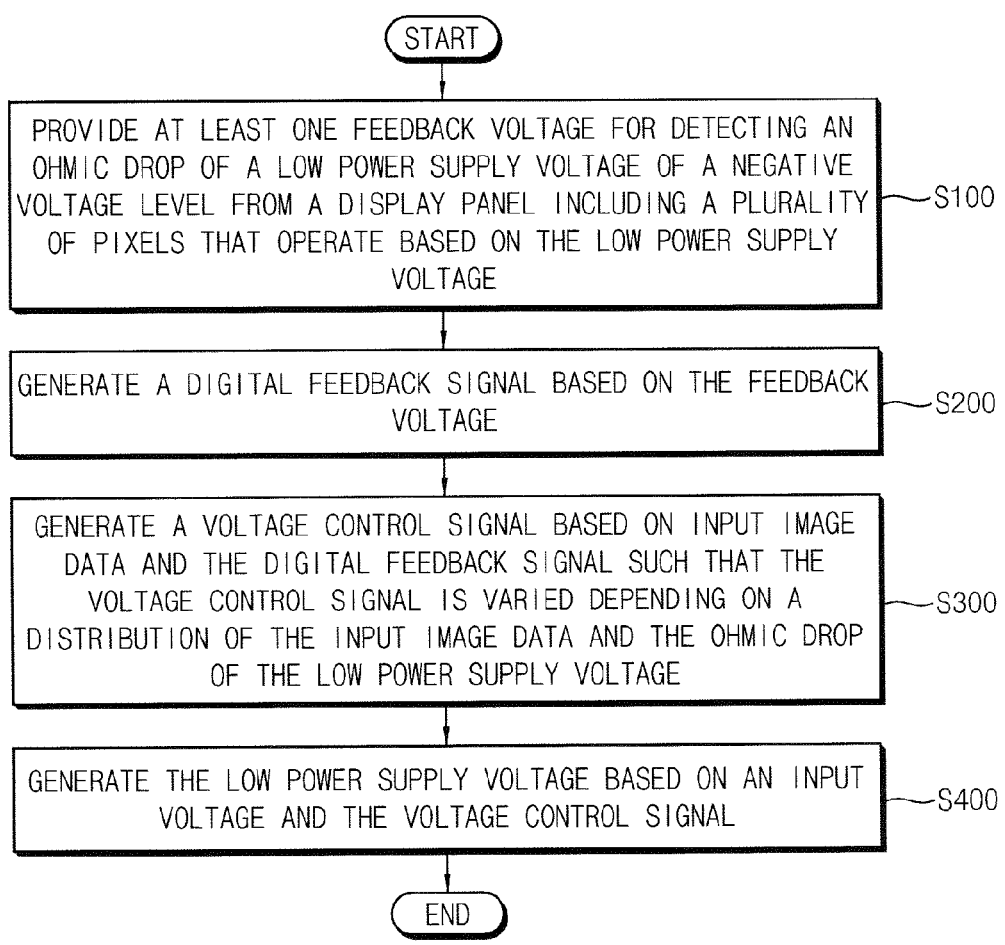
FIG. 1 is a flowchart illustrating a method of driving an electroluminescent display according to example embodiments.

In electroluminescent displays, a driving current flowing through the OLED in the pixel increases as a driving voltage increases where the driving voltage corresponds to the difference between a high power supply voltage and a low power supply voltage. As the driving voltage increases, quality of the displayed image can be enhanced but power consumption increases.

The example embodiments are described more fully hereinafter with reference to the accompanying drawings. Like or similar reference numerals refer to like or similar elements throughout. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a flowchart illustrating a method of driving an electroluminescent display according to example embodiments.

In some embodiments, the FIG. 1 procedure is implemented in a conventional programming language, such as C or C++ or another suitable programming language. The program can be stored on a computer accessible storage medium of the electroluminescent display 10 (see FIG. 2), for example, a memory (not shown) of the electroluminescent display 10, adaptive voltage controller 20 (see FIG. 2) or the timing controller 650 (see FIG. 20). In certain embodiments, the storage medium includes a random access memory (RAM), hard disks, floppy disks, digital video devices, compact discs, video discs, and/or other optical storage mediums, etc. The program can be stored in the processor. The processor can have a configuration based on, for example, i) an advanced RISC machine (ARM) microcontroller and ii) Intel Corporation's microprocessors (e.g., the Pentium family microprocessors). In certain embodiments, the processor is implemented with a variety of computer platforms using a single chip or multichip microprocessors, digital signal processors, embedded microprocessors, microcontrollers, etc. In another embodiment, the processor is implemented with a wide range of operating systems such as Unix, Linux, Microsoft DOS, Microsoft Windows 8/7/Vista/2000/9x/ME/XP, Macintosh OS, OS X, OS/2, Android, iOS and the like. In another embodiment, at least part of the procedure can be implemented with embedded software. Depending on the embodiment, additional states can be added, others removed, or the order of the states changed in FIG. 1.

Referring to FIG. 1, at least one feedback voltage VFB for detecting an IR drop or an ohmic drop IRD of a low power supply voltage or first power supply voltage ELVSS of a negative voltage level from a display panel (S100) and a digital feedback signal DG_VFB is generated based on the feedback voltage VFB (S200). A voltage control signal DG_ELVSS is generated based on input image data RGB_DATA and the digital feedback signal DG_VFB such that the voltage control signal DG_ELVSS is varied depending on a distribution of the input image data RGB_DATA and the ohmic drop IRD of the low power supply voltage ELVSS (S300). The low power supply voltage ELVSS is generated based on an input voltage VIN and the voltage control signal DG_ELVSS (S400).

As will be described with reference to FIGS. 6, 7 and 20, the display panel includes a plurality of pixels that operate based on the low power supply voltage ELVSS. The pixels can receive a high power supply voltage or second power supply voltage ELVDD of a positive voltage level and a low power supply voltage ELVSS of a negative voltage level and generate a driving current depending on the difference between the high power supply voltage ELVDD and the low power supply voltage ELVSS to display an image. The described technology includes how to control the low power supply voltage ELVSS and thus the description of the high power supply voltage can be omitted except when it is necessary in this disclosure.

The power supply voltage can be controlled to reduce power consumption by analyzing brightness of a displayed image. However, the display quality recognized by a user can be degraded because the brightness ratio and the driving current do not coincide with respective colors, if the power supply voltage is controlled based on only the image brightness analysis. In addition, the sufficient driving voltage has to be secured because it is difficult to predict a precise ohmic drop depending on the image, and thus the effect of reducing power consumption is relieved. In some embodiments, power consumption is reduced while suppressing degradation of display quality, by detecting the ohmic drop of the low power supply voltage using the feedback voltage and controlling the low power supply voltage based on the detected ohmic drop.

Figure 2:
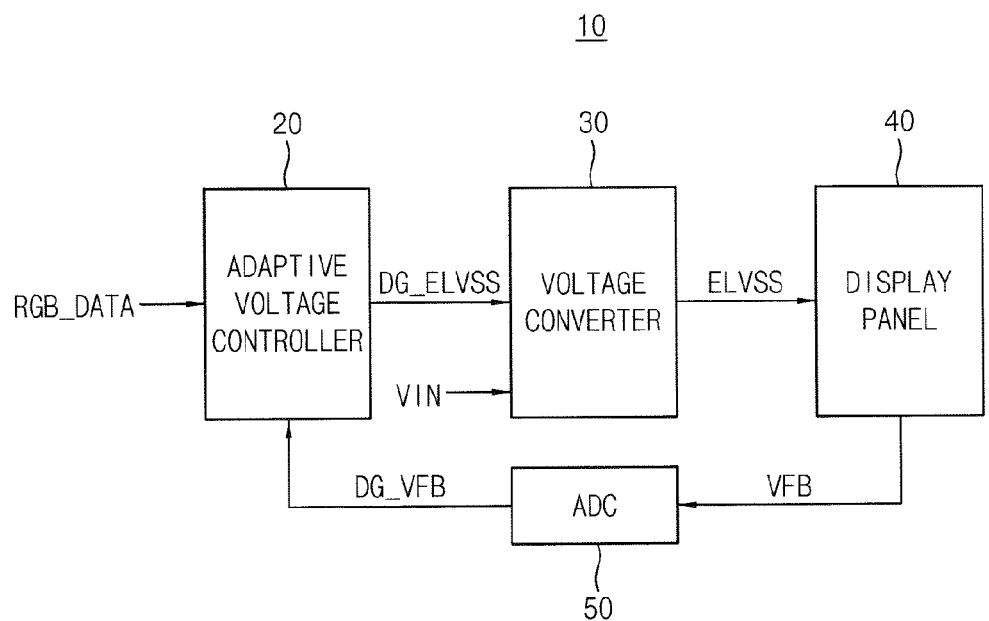
FIG. 2 is a block diagram illustrating an electroluminescent display according to example embodiments.
Figure 3:
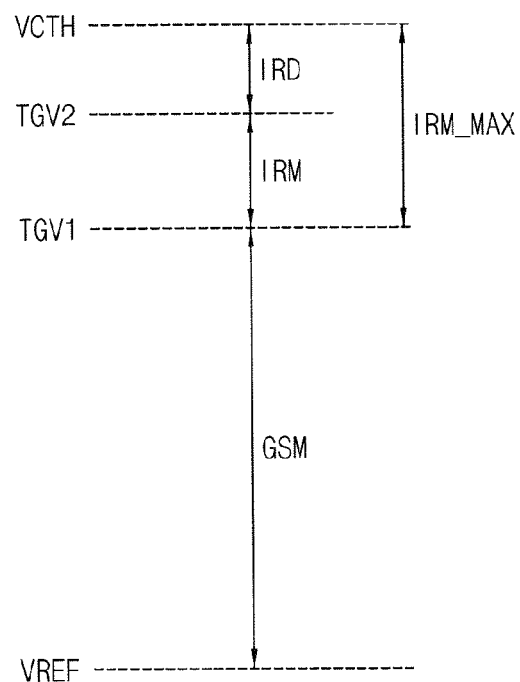
FIG. 3 is a diagram for describing processes of controlling a low power supply voltage of the electroluminescent display of FIG. 2.

FIG. 2 is a block diagram illustrating an electroluminescent display according to example embodiments. FIG. 3 is a diagram for describing processes of controlling a low power supply voltage of the electroluminescent display of FIG. 2.

Referring to FIG. 2, an electroluminescent display 10 includes an adaptive voltage controller 20, a voltage converter 30, a display panel 40 and an analog-to-digital converter (ADC) 50.

The display panel 40 includes a plurality of pixels that operate based on a low power supply voltage ELVSS of a negative voltage level. The display panel 40 and the pixel will be described with reference to FIGS. 6, 7 and 20.

The analog-to-digital converter 50 can generate at least one digital feedback signal DG_VFB based on at least one feedback voltage VFB that is provided from the display panel 40 for detecting an ohmic drop IRD of the low power supply voltage ELVSS. In some embodiments, the feedback voltage VFB is one analog voltage sampled at one position of the display panel 40. In other embodiments, the feedback voltage VFB is a plurality of analog voltages sampled at a plurality of positions of the display panel 40, respectively. Sampling of the feedback voltage VFB will be further described with reference to FIG. 8.

The adaptive voltage controller 20 can generate a voltage control signal DG_ELVSS based on input image data RGB_DATA and the digital feedback signal DG_ELVSS such that the voltage control signal DG_ELVSS is varied depending on a distribution of the input image data RGB_DATA and the ohmic drop IRD of the low power supply voltage ELVSS. In some embodiments, the distribution of the input image data RGB_DATA includes a maximum grayscale of the input image data RGB_DATA as will be described with reference to FIG. 3. In other embodiments, the distribution of the input image data RGB_DATA can include a maximum grayscale and an average grayscale of the input image data RGB_DATA as will be described with reference to FIG. 14.

The voltage converter 30 generates the low power supply voltage ELVSS based on an input voltage VIN and the voltage control signal DG_ELVSS. The voltage control signal DG_ELVSS includes information on a voltage level of the low power supply voltage ELVSS, and the voltage converter 30 generates the low power supply voltage ELVSS having the voltage level corresponding to the voltage control signal DG_ELVSS. The voltage converter can lower a DC voltage to generate the low power supply voltage ELVSS of a negative voltage level.

Referring to FIGS. 2 and 3, the adaptive voltage controller 20 adjusts the voltage control signal DG_ELVSS such that the low power supply voltage ELVSS is maintained at a second target voltage TGV2. The target voltage TGV2 can be greater than a reference voltage VREF by the sum GSM-FIRM of a grayscale margin GSM and an ohmic drop margin IRM. The grayscale margin GSM can be varied depending on a maximum grayscale of the input image data RGB_DATA and the ohmic drop margin IRM can be varied depending on the ohmic drop IRD of the low power supply voltage ELVSS. The reference voltage can correspond to a minimum voltage level of the low power supply voltage ELVSS. A voltage greater than the reference voltage VREF by the grayscale margin GSM can be referred to as a first target voltage TGV1 and a voltage higher than the reference voltage VREF by the sum of the grayscale margin GSM and the ohmic drop margin IRM can be referred to as the second target voltage TGV2. The adaptive voltage controller can determine the grayscale margin GSM and the ohmic drop margin IRM.

The grayscale margin GSM can decrease as the maximum grayscale of the input image RGB_DATA data increases. When the maximum grayscale of the input image data RGB_DATA increases, the driving voltage VEL of the pixel has to be increased to represent a wider range of the grayscale. If the high power supply voltage ELVDD is maintained at a constant voltage level regardless of the maximum grayscale of the input image data RGB_DATA, the low power supply voltage has to be lowered to the lower negative voltage level to increase the driving voltage VEL. For example, when the input image data RGB_DATA is represented by the pixel data of 8 bits, the grayscale margin GSM is the maximum if the maximum grayscale is zero and the grayscale margin GSM is zero if the maximum grayscale is 255. The mapping relationship between the maximum grayscale and the grayscale margin GSM can be determined based on characteristics of the pixels and can be provided in a form of a lookup table.

The ohmic drop margin IRM can decrease as the ohmic drop IRD of the low power supply voltage ELVSS increases. As illustrated in FIG. 3, the maximum ohmic drop margin IRM_MAX can correspond to an upper limit of a cathode voltage VCTH that is applied to a cathode electrode of the OLED in the pixel. The maximum ohmic drop margin IRM_MAX corresponds to the ohmic drop IRD when all pixel data have the maximum grayscale, that is, when all pixels have the maximum pixel driving currents. For example, the maximum ohmic drop margin IRM_MAX is represented by the sum of the ohmic drop ID and the ohmic drop margin IRM. As a result, the ohmic drop margin IRM can decrease as the ohmic drop IRD increases and the ohmic drop margin IRM can increase as the ohmic drop IRD decreases.

In some embodiments, power consumption is reduced while suppressing degradation of display quality, by detecting the ohmic drop IRD of the low power supply voltage ELVSS using the feedback voltage VFB and controlling the low power supply voltage ELVSS based on the detected ohmic drop IRD.

Figure 4:
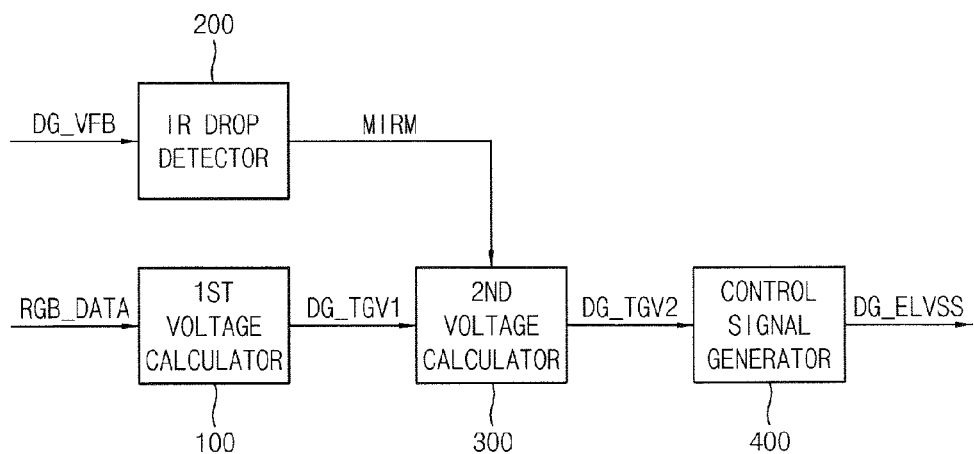
FIG. 4 is a block diagram illustrating an example embodiment of an adaptive voltage controller included in the electroluminescent display of FIG. 2.

FIG. 4 is a block diagram illustrating an example embodiment of an adaptive voltage controller included in the electroluminescent display of FIG. 2.

Referring to FIG. 4, an adaptive voltage controller 20 includes a first voltage calculator 100, an ohmic drop detector 200, a second voltage calculator 300 and a control signal generator 400.

The first voltage calculator 100 can generate a first target voltage signal DG_TGV1 indicating a first target voltage TGV1 based on the input image data RGB_DATA. The first target voltage TGV1 can be varied depending on a maximum grayscale of the input image data RGB_DATA. The first target voltage TGV1 can be an analog value and the first target voltage signal DG_TGV1 can be a digital value corresponding to the analog value.

The ohmic drop detector 200 can provide a measured ohmic drop margin MIRM based on the digital feedback signal DG_VFB. The measured ohmic drop margin MIRM can be varied depending on the ohmic drop IRD of the low power supply voltage ELVSS.

The second voltage calculator 300 can generate a second target voltage signal DG_TGV2 indicating a second target voltage TGV2 based on the first target voltage signal DG_TGV1 and the measured ohmic drop margin MIRM where the second target voltage TGV2 is higher than the first target voltage TGV1 by the measured ohmic drop margin MIRM. The second target voltage TGV2 can be an analog value and the second target voltage signal DG_TGV2 can be a digital value corresponding to the analog value.

The control signal generator 400 can generate the voltage control signal DG_ELVSS based on the second target voltage signal DG_TGV2. The control signal generator 400 can adjust the voltage control signal DG_ELVSS such that the low power supply voltage ELVSS can follow the second target voltage TGV2, that is, the low power supply voltage ELVSS can be maintained at the second target voltage TGV2. For example, as will be described with reference to FIGS. 12, 13 and 14, the control signal generator 400 adjusts the voltage control signal DG_ELVSS per frame period so that the low power supply voltage ELVSS is decreased or increased stepwise per frame period.

Figure 5:
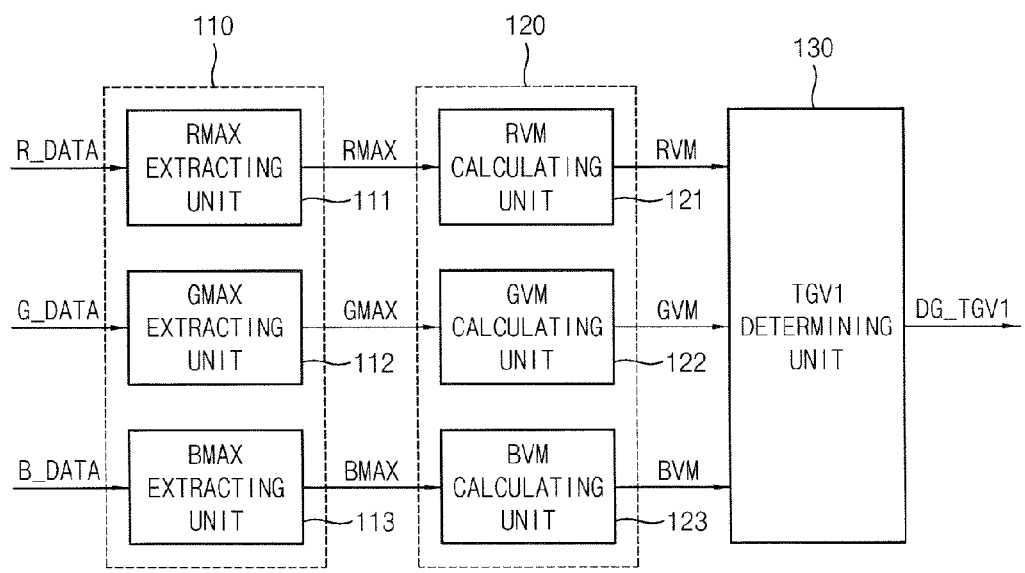
FIG. 5 is a block diagram illustrating an example embodiment of a first voltage calculator included in the adaptive voltage controller of FIG. 4.

FIG. 5 is a block diagram illustrating an example embodiment of a first voltage calculator included in the adaptive voltage controller of FIG. 4.

Referring to FIG. 5, a first voltage calculator 100 includes a maximum grayscale extracting unit or maximum grayscale extractor 110, a minimum voltage calculating unit or minimum voltage calculator 120 and a first target voltage determining unit or first target voltage determiner 130. The input image data RGB_DATA can include red data R_DATA, green data G_DATA and blue data B_DATA, and the first voltage calculator 100 can extract a maximum grayscale RMAX of the red data R_DATA, a maximum grayscale GMAX of the green data G_DATA and a maximum grayscale BMAX of the blue data B_DATA to determine the first target voltage TGV1.

The maximum grayscale extracting unit 110 can include a red maximum grayscale extracting unit 111, a green maximum grayscale extracting unit 112 and a blue maximum grayscale extracting unit 113. The minimum voltage calculating unit 120 can include a red minimum voltage calculating unit 121, a green minimum voltage calculating unit 122 and a blue minimum voltage calculating unit 123.

The maximum grayscale extracting unit 110 can extract the maximum grayscale RMAX of the red data R_DATA, the maximum grayscale GMAX of the green data G_DATA and the maximum grayscale BMAX of the blue data B_DATA per frame period. More specifically, the red maximum grayscale extracting unit 111 can sequentially receive the red data R_DATA of each frame and extract the highest grayscale in the frame as the maximum grayscale RMAX of the red data R_DATA. The green maximum grayscale extracting unit 112 can sequentially receive the green data G_DATA of each frame and extract the highest grayscale in the frame as the maximum grayscale GMAX of the green data G_DATA. The blue maximum grayscale extracting unit 113 can sequentially receive the blue data B_DATA of each frame and extract the highest grayscale in the frame as the maximum grayscale BMAX of the blue data B_DATA.

The minimum voltage calculating unit 120 can calculate a first voltage RVM corresponding to the maximum grayscale RMAX of the red data R_DATA, a second voltage GVM corresponding to the maximum grayscale GMAX of the green data G_DATA and a third voltage BVM corresponding to the maximum grayscale BMAX of the blue data B_DATA. More specifically, the red minimum voltage calculating unit 121 can receive the maximum grayscale RMAX of the red data R_DATA and output the first voltage RVM corresponding to the maximum grayscale RMAX to the first target voltage determining unit 130. The green minimum voltage calculating unit 122 can receive the maximum grayscale GMAX of the green data G_DATA and output the second voltage GVM corresponding to the maximum grayscale GMAX to the first target voltage determining unit 130. The blue minimum voltage calculating unit 123 can receive the maximum grayscale BMAX of the blue data B_DATA and output the third voltage BVM corresponding to the maximum grayscale BMAX to the first target voltage determining unit 130. The mapping relationship between the maximum grayscales RMAX, GMAX and BMAX and the voltages RVM, GVM and BVM for the grayscale margin GSM can be determined based on characteristics of the pixels and can be provided in a form of a lookup table.

The first target voltage determining unit 130 can compare the first voltage RVM from the red minimum voltage calculating unit 121, the second voltage GVM from the green minimum voltage calculating unit 122 and the third voltage BVM from the blue minimum voltage calculating unit 123. The first target voltage determining unit 130 can determine the lowest voltage among the voltages RVM, GVM and BVM as the first target voltage TGV1 to generate the first target voltage signal DG_TGV1 corresponding to the first target voltage TGV1.

Figure 6:
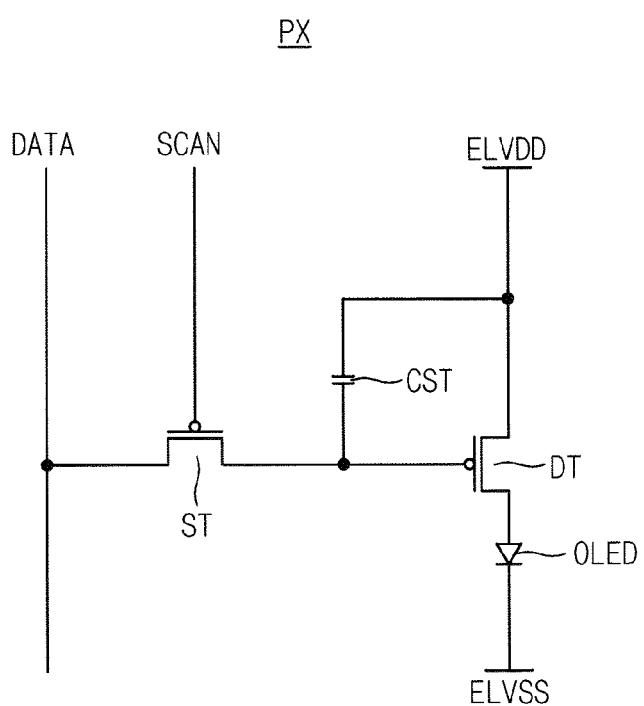
FIG. 6 is a circuit diagram illustrating an example of a pixel included in the electroluminescent display of FIG. 2.

FIG. 6 is a circuit diagram illustrating an example of a pixel included in the electroluminescent display of FIG. 2.

Referring to FIG. 6, each pixel PX includes a switching transistor ST, a storage capacitor CST, a driving transistor DT and an OLED.

The switching transistor ST has a first source/drain terminal connected to a data line, a second source/drain terminal connected to the storage capacitor CST, and a gate terminal connected to the scan line. The switching transistor ST transfers a data signal DATA received from a data driver to the storage capacitor CST in response to a scan signal SCAN received from a scan driver.

The storage capacitor CST has a first terminal connected to the high power supply voltage ELVDD and a second terminal connected to a gate terminal of the driving transistor DT. The storage capacitor CST stores a voltage of the data signal DATA transferred through the switching transistor ST.

The driving transistor DT has a first source/drain terminal connected to the high power supply voltage ELVDD, a second source/drain terminal connected to the OLED, and the gate terminal connected to the storage capacitor CST. The driving transistor DT can be turned on or off according to the data signal DATA stored in the storage capacitor CST. The OLED has an anode electrode connected to the driving transistor DT and a cathode electrode connected to a low power supply voltage ELVSS.

The OLED can emit light based on a driving current flowing from the high power supply voltage ELVDD to the low power supply voltage ELVSS while the driving transistor DT is turned on. This simple structure of each pixel PX, or a 2T1C structure including two transistors ST and DT and one capacitor CST is one example of a pixel structure that is suitable for a large sized display.

Figure 7:
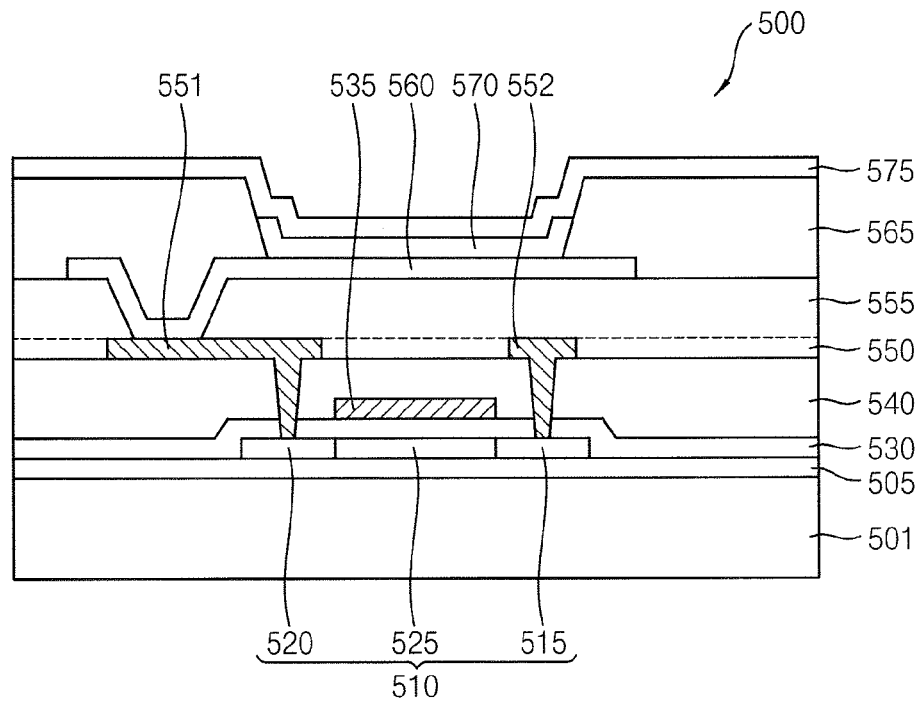
FIG. 7 is a cross-sectional view for describing a vertical structure of a display panel included in the display of FIG. 2.

FIG. 7 is a cross-sectional view for describing a vertical structure of a display panel included in the display of FIG. 2.

FIG. 7 illustrates only the driving transistor DT and the OLED among the elements in the pixel PX of FIG. 6. Referring to FIG. 7, the display panel 500 includes a substrate 501, a buffer layer 505, an active pattern 510, a gate insulation layer 530, a gate electrode 535, a first insulation interlayer 540, connection patterns 551 and 552 formed in the metal layer 550, a second insulation interlayer 555, an anode electrode 560, a pixel definition layer 565, an organic light-emitting layer 570, and a cathode electrode 575.

The buffer layer 505 is formed on the substrate 501 and the active pattern 510 can be formed on the buffer layer 505, where the substrate 501 can be formed of an insulation material such as glass, transparent plastic, ceramic, etc. The active pattern 510 can be formed by a sputtering process, a CVD process, a printing process, a spray process, a vacuum deposition process, an ALD process, a sol-gel process, PECVD process, etc. The active pattern 510 can include source and drain regions 515 and 520 and channel region 525 located below the gate electrode 535.

The gate insulation layer 530 can be formed to cover the active pattern 510. The gate insulation layer 530 can be formed by a CVD process, a thermal oxidation process, a plasma enhanced chemical vapor deposition (PECVD) process, a high density plasma-chemical vapor deposition (HDP-CVD) process, etc. The gate insulation layer 530 can be a relatively thick to sufficiently cover the active pattern 510.

The gate electrode 535 can be formed on the gate insulation layer 530. The gate electrode 535 can be formed by a sputtering process, a CVD process, a printing process, a spray process, a vacuum deposition process, an ALD process, etc.

The active pattern 510 can be doped by the impurity after the gate electrode 535 is formed. The source and drain regions 515 and 520 can be doped by the impurity. In some embodiments, the channel region 525 located below the gate electrode 535 is not doped. As a result, the source and drain regions 515 and 520 can act as the conductor and the channel region 525 can act as the channel of the driving transistor DT.

The first insulation interlayer 540 can be formed on the gate insulation layer 530 to cover the gate electrode 535. The first insulation interlayer 540 can be relatively thick to sufficiently cover the sixth gate electrode 535. The first insulation interlayer 540 can have a substantially flat upper surface. In some embodiments, a planarization process is executed on the first insulation interlayer 540 to enhance the flatness of the first insulation interlayer 540.

The first insulation interlayer 540 can be partially etched to form contact holes partially exposing the source and drain regions 515 and 520 of the active pattern 510. The connection patterns 551 and 552 can be formed in the metal layer 550 by filling the contact holes.

The second insulation interlayer 555 can be formed on the first insulation interlayer 540 to cover the connection patterns 551 and 552. The second insulation interlayer 555 can be relatively thick to sufficiently cover the connection patterns 551 and 552. The second insulation interlayer 555 can have a substantially flat upper surface. In some embodiments, a planarization process is executed on the second insulation interlayer 555 to enhance the flatness of the second insulation interlayer 555.

The second insulation interlayer 555 can be partially etched to form a contact hole partially exposing a portion of the connection pattern 551. The anode electrode 560 can be formed on the second insulation interlayer 555 by filling the contact hole.

The pixel definition layer 565 can be formed on the second insulation interlayer 555 to cover the anode electrode 560. The pixel definition layer 565 can be relatively thick to sufficiently cover the anode electrode 560.

The pixel definition layer 565 can be partially etched to form an opening that exposes the anode electrode 560. The organic light emitting layer 570 can be formed in the opening. The organic light emitting layer 570 can be formed on the anode electrode 560 exposed by the opening.

The cathode electrode 575 can be formed on the pixel definition layer 565 and organic light emitting layer 570. The cathode electrode can be formed as a whole to cover the entire active region in which a plurality of pixels are formed. The above mentioned feedback voltage VFB corresponding to the IR-droped low power supply voltage can be sampled from at least one position on the cathode electrode 575 that covers the entire active region.

The pixel structure described with reference to FIGS. 6 and 7 is a non-limiting example for describing example embodiments, and the pixel structure can be changed variously.

Figure 8:
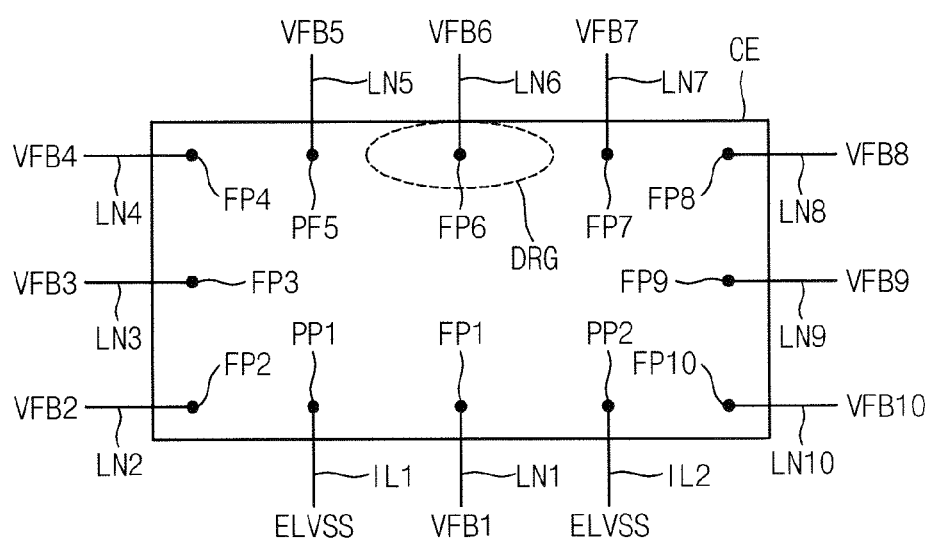
FIG. 8 is a diagram for describing an example embodiment of providing feedback voltages for detecting an ohmic drop of a low power supply voltage.

FIG. 8 is a diagram for describing an example embodiment of providing feedback voltages for detecting an ohmic drop of a low power supply voltage.

Referring to FIG. 8, the above-mentioned feedback voltage VFB includes a plurality of feedback voltages VFB1~VFB 10 that are provided to the analog-to-digital converter 50 in FIG. 2 through a plurality of conduction lines LN1~LN10. The conduction lines LN1~LN10 can be respectively connected to a plurality of detection points FP1~FP10 on a cathode electrode CE included in the display panel. In this case, as will be described with reference to FIG. 9, the ohmic drop IRD of the low power supply voltage ELVSS can correspond to the difference between a maximum feedback voltage among the feedback voltages VFB1~VFB10 and the low power supply voltage ELVSS applied to the display panel, that is, the low power supply voltage ELVSS before the ohmic drop IRD or the IR drop occurs. The maximum feedback voltage corresponds to the feedback voltage that is sampled at the detection point where the ohmic drop is the greatest.

When the low power supply voltage ELVSS is supplied through lead lines IL1 and IL2 connected to the power points PP1 and PP2 in a bottom portion of the cathode electrode CE, the greatest ohmic drop of the low power supply voltage ELVSS occurs in a central upper portion DRG of the cathode electrode CE. In some embodiments, the detection point of the greatest ohmic drop can be predicted from the determined structure of the display panel and only one feedback voltage can be sampled from the predicted detection point.

Figure 9:
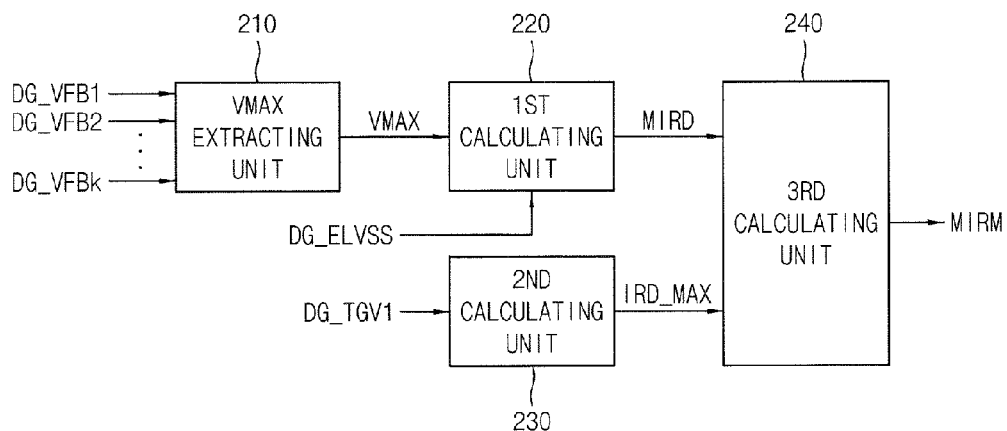
FIG. 9 is a block diagram illustrating an example embodiment of an ohmic drop detector included in the adaptive voltage controller of FIG. 4.

FIG. 9 is a block diagram illustrating an example embodiment of an ohmic drop detector included in the adaptive voltage controller of FIG. 4.

Referring to FIG. 9, an ohmic drop detector 200 includes a maximum feedback voltage extracting unit or maximum feedback voltage extractor 210, a first calculating unit or first calculator 220, a second calculating unit or second calculator 230 and a third calculating unit or third calculator 240.

The maximum feedback voltage extracting unit 210 can extract and provide a maximum feedback voltage VMAX based on a plurality of digital feedback signals DG_VFB1~DG_VFBk respectively corresponding to a plurality of feedback voltages VFB1~VFBk. As described above, the maximum feedback voltage VMAX corresponds to the feedback voltage that is sampled at the detection point where the ohmic drop is the greatest.

The first calculating unit 220 can provide a measured ohmic drop MIRD based on the maximum feedback voltage VMAX and the voltage control signal DG_ELVSS. As described above, the voltage control signal DG_ELVSS can include information on a voltage level of the low power supply voltage ELVSS, and the first calculating unit 220 can calculate the voltage level of the low power supply voltage ELVSS applied to the display panel, that is, the low power supply voltage ELVSS before the ohmic drop IRD or the IR drop occurs. The first calculating unit 220 can provide a difference between the maximum feedback voltage VMAX and the calculated low power supply voltage ELVSS as the measured ohmic drop MIRD.

The second calculating unit 230 can provide a maximum ohmic drop IRD_MAX based on the first target voltage signal DG_TGV1. The maximum ohmic drop IRD_MAX corresponds to the ohmic drop IRD when all pixel data have the maximum grayscale, that is, when all pixels have the maximum pixel driving currents. The maximum ohmic drop IRD_MAX can be substantially the same as the maximum ohmic drop margin IRM_MAX described with reference to FIG. 3. The first target voltage signal DG_TGV1 can include information on the maximum grayscale of the input image data RGB_DATA as described with reference to FIG. 5. The second calculating unit 230 can extract the maximum grayscale corresponding to the first target voltage signal DG_TGV1 and calculate the maximum ohmic drop IRD_MAX based on the extracted maximum grayscale.

The third calculating unit 240 can provide the measured ohmic drop margin MIRM based on the measured ohmic drop MIRD and the maximum ohmic drop IRD_MAX. For example, the third calculating unit 240 calculates and provides the difference between the maximum ohmic drop IRD_MAX and the measured ohmic drop MIRD as the measured ohmic drop margin MIRM. As described with reference FIG. 3, the measured ohmic drop margin MIRM can decrease as the measured ohmic drop increases.

Figure 10:
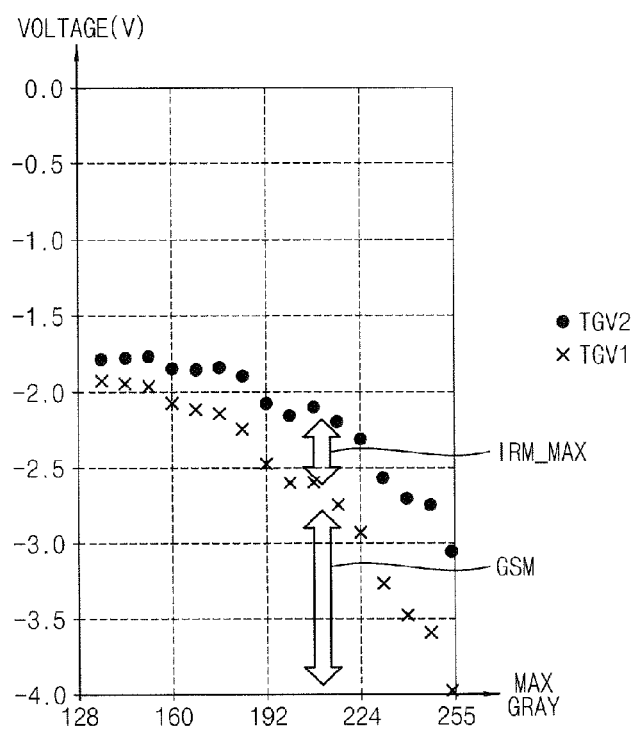
FIG. 10 is a diagram illustrating a change of a target voltage depending on a maximum grayscale and an ohmic drop.

FIG. 10 is a diagram illustrating a change of a target voltage depending on a maximum grayscale and an ohmic drop.

In FIG. 10, a horizontal axis represents a maximum grayscale of input image data comprised of 8-bit pixel data, and a vertical axis represents a target voltage of the low power supply voltage ELVSS. The first target voltage TGV1 is represented by x characters and the second target voltage TGV2 is represented by small black circles.

Referring to FIG. 10, the first target voltage TGV1 is higher than the reference voltage VREF (e.g., about −4 V) by the grayscale margin GSM, and the second target voltage TGV2 is higher than the reference voltage VREF by the sum of the grayscale margin GSM and the ohmic drop margin IRM. FIG. 10 illustrates a case when the ohmic margin IRM is substantially the same as the maximum ohmic drop margin IRM_MAX, that is, the ohmic drop IRD is substantially zero. The ohmic drop margin IRM can decrease as the ohmic drop IRD of the low power supply voltage ELVSS increases. The measured ohmic drop MIRD detected using the feedback voltage VFB is greater than zero and thus the real second target voltage TGV2 is lower than the level illustrated in FIG. 10.

The power supply voltage can be controlled to reduce power consumption by analyzing brightness of a displayed image. However, the display quality recognized by a user can be degraded because the brightness ratio and the driving current do not coincide with the respective colors, if the power supply voltage is controlled based on only the image brightness analysis. In addition, the sufficient driving voltage has to be secured because it is difficult to predict a precise ohmic drop depending on the image, and thus the effect of reducing power consumption is relieved. In some embodiments, power consumption is reduced while suppressing degradation of display quality, by reflecting the ohmic drop margin IRM in addition to the grayscale margin GSM.

Figure 11:
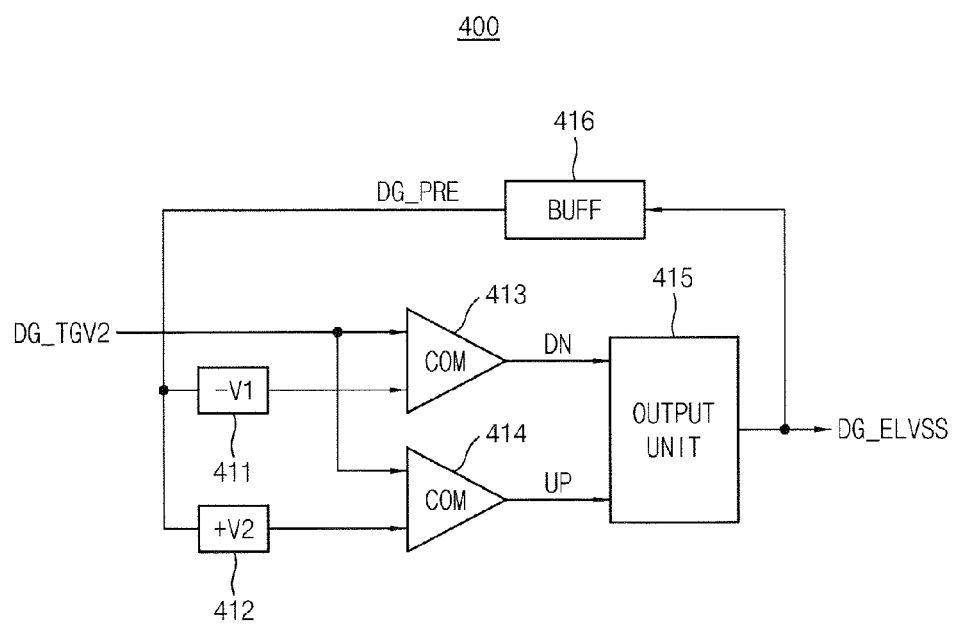
FIG. 11 is a block diagram illustrating an example embodiment of a control signal generator included in the adaptive voltage controller of FIG. 4.
Figure 12:
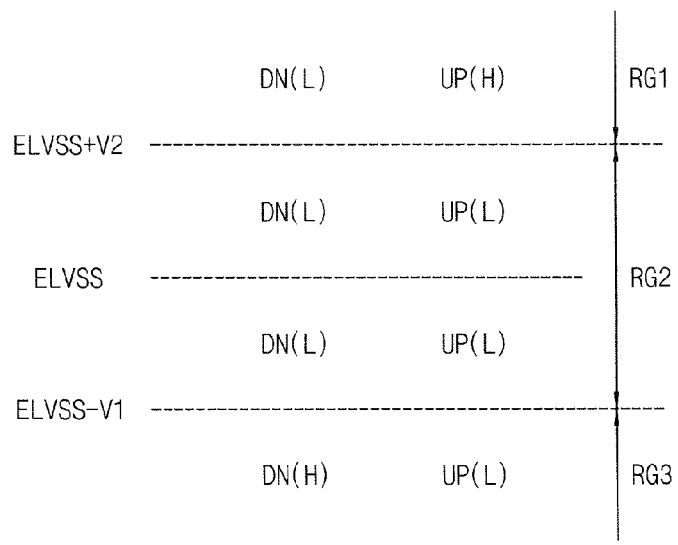
FIG. 12 is a diagram for describing operations of the control signal generator of FIG. 11.

FIG. 11 is a block diagram illustrating an example embodiment of a control signal generator included in the adaptive voltage controller of FIG. 4. FIG. 12 is a diagram for describing operations of the control signal generator of FIG. 11.

Referring to FIG. 11, a control signal generator 400 includes a subtractor 411, an adder 412, a first comparator 413, a second comparator 414, an output unit 415 and a buffer 416.

The buffer 416 can store a voltage control signal DG_ELVSS for one frame period to provide the voltage control signal DG_ELVSS of a previous frame. The subtractor 411 can provide an output ELVSS_V1 corresponding to the low power supply voltage ELVSS of the previous frame subtracted by a first voltage V1. The adder 412 can provide an output ELVSS+V2 corresponding to the low power supply voltage ELVSS of the previous frame added to a second voltage V2.

The first comparator 413 can compare the second target voltage signal DG_TGV2 and the output of the subtractor 411 to output a down signal DN. The first comparator 413 can activate the down signal DN to a logic high level when the second target voltage signal DG_TGV2 is less than the output of the subtractor 411 and deactivate the down signal DN to a logic low level when the second target voltage signal DG_TGV2 is greater than the output of the subtractor 411. As a result, as illustrated in FIG. 12, the down signal DN is deactivated to the logic low level L when the second target voltage TGV2 is in a first range RG1 and a second range RG2, and the down signal DN can be activated to the logic high level H when the second target voltage TGV2 is in a third range RG3.

The second comparator 414 can compare the second target voltage signal DG_TGV2 and the output of the adder 412 to output an up signal UP. The second comparator 414 can activate the up signal UP to a logic high level when the second target voltage signal DG_TGV2 is greater than the output of the adder 412 and deactivate the up signal UP to a logic low level when the second target voltage signal DG_TGV2 is less than the output of the adder 412. As a result, as illustrated in FIG. 12, the up signal UP is activated to the logic high level H when the second target voltage TGV2 is in the first range RG1, and the up signal UP is deactivated to the logic low level L when the second target voltage TGV2 is in the second range RG2 and the third range RG3.

The output unit 415 can adjust the voltage control signal DG_ELVSS so that the low power supply voltage ELVSS can be decreased, when the down signal DN is activated, that is, when the second target voltage TGV2 is in the third range RG3. The output unit 415 can adjust the voltage control signal DG_ELVSS so that the low power supply voltage ELVSS can be increased, when the up signal UP is activated, that is, when the second target voltage TGV2 is in the first range RG1. The output unit can maintain the voltage control signal DG_ELVSS so that the low power supply voltage ELVSS can be maintained, when both of the down signal DN and the up signal UP are deactivated, that is, the second target voltage TGV2 is in the second range RG2.

Figure 13:
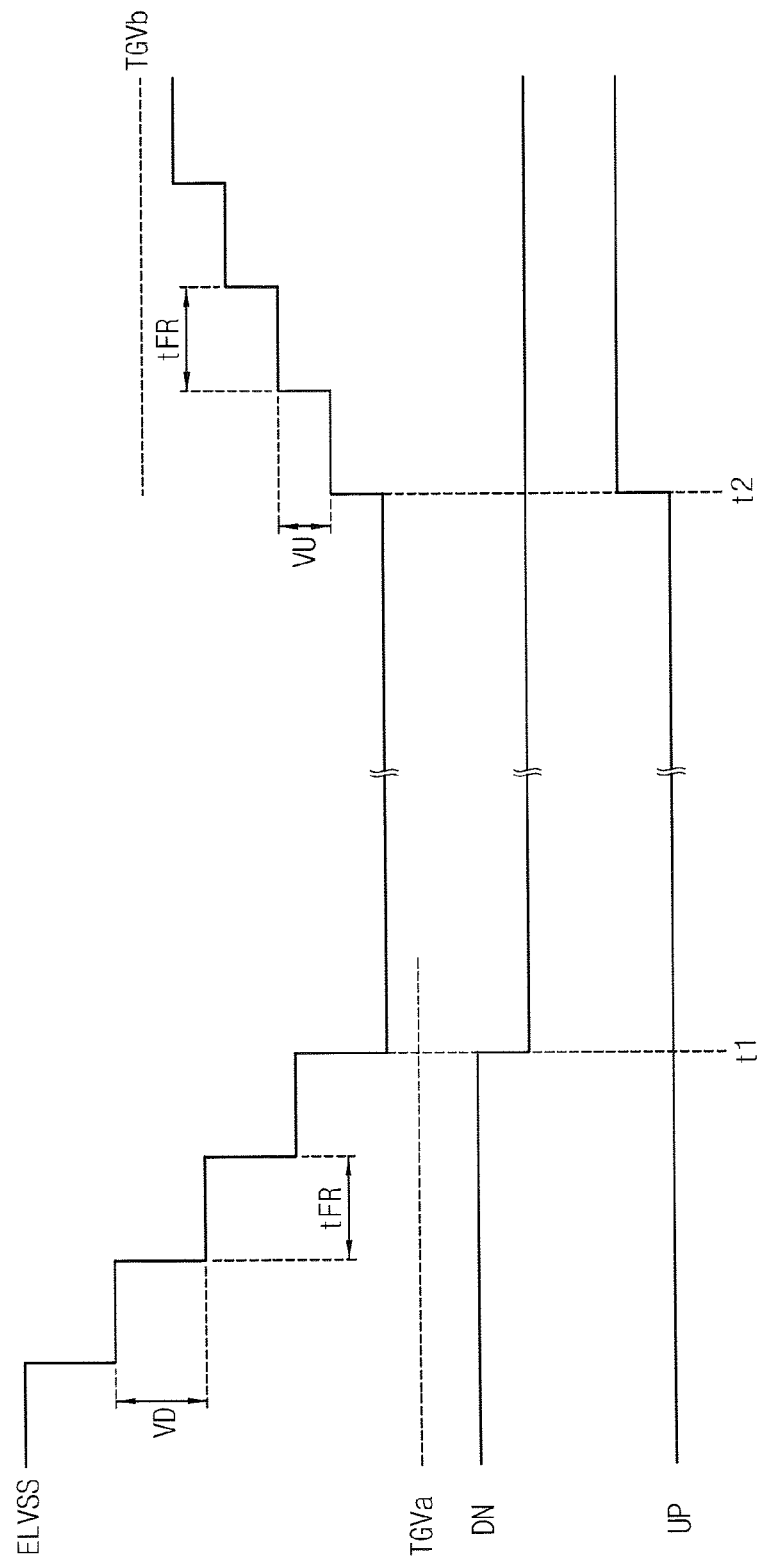
FIG. 13 is a timing diagram illustrating an example of controlling a low power supply voltage using the control signal generator of FIG. 11.

FIG. 13 is a timing diagram illustrating an example of controlling a low power supply voltage using the control signal generator of FIG. 11.

Referring to FIGS. 11 and 13, the control signal generator 400 adjusts the voltage control signal DG_ELVSS per frame period so that the low power supply voltage ELVSS is decreased or increased stepwise per frame period to follow the second target voltage TGV2.

The down signal DN is activated until a time point t1 while the low power supply voltage ELVSS is higher than the second target voltage TGVa. The control signal generator 400 can adjust the voltage control signal DG_ELVSS in response to the activated down signal DN such that the low power supply voltage ELVSS can be decreased stepwise by a first voltage interval VD per frame period tFR.

The up signal UP is activated after a time point t2 while the low power supply voltage ELVSS is lower than the second target voltage TGVb. The control signal generator 400 can adjust the voltage control signal DG_ELVSS in response to the activated up signal UP such that the low power supply voltage ELVSS can be increased stepwise by a second voltage interval VU per frame period tFR.

In some embodiments, the first voltage interval VD is set to be greater than the second voltage interval VU. The low power supply voltage ELVSS can reach the target voltage TGVa rapidly when the low power supply voltage ELVSS is decreased, but the low power supply voltage ELVSS can reach the target voltage TGVb slowly when the low power supply voltage ELVSS is increased. The image quality recognized by a user can be relieved by rapidly decreasing the low power supply voltage ELVDD, that is, by rapidly increasing the driving voltage corresponding to a difference between the high power supply voltage ELVDD and the low power supply voltage ELVSS, when the brightness of the displayed image is increased.

Figure 14:
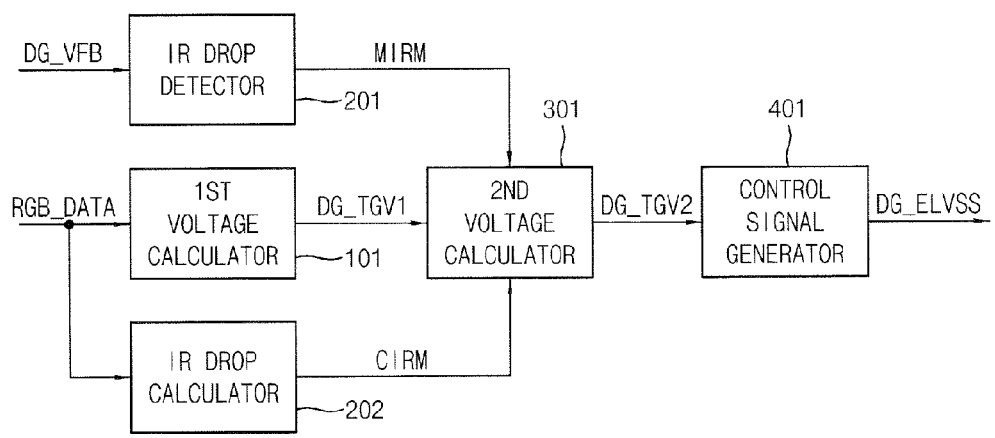
FIG. 14 is a block diagram illustrating an example embodiment of an adaptive voltage controller included in the electroluminescent display of FIG. 2.

FIG. 14 is a block diagram illustrating an example embodiment of an adaptive voltage controller included in the electroluminescent display of FIG. 2.

Referring to FIG. 14, an adaptive voltage controller 21 includes a first voltage calculator 101, an ohmic drop detector 201, an ohmic drop calculator 202, a second voltage calculator 301 and a control signal generator 401.

The first voltage calculator 101 can generate a first target voltage signal DG_TGV1 indicating a first target voltage TGV1 based on the input image data RGB_DATA. The first target voltage TGV1 can be varied depending on a maximum grayscale of the input image data RGB_DATA. The first target voltage TGV1 can be an analog value and the first target voltage signal DG_TGV1 can be a digital value corresponding to the analog value.

The ohmic drop detector 201 can provide a measured ohmic drop margin MIRM based on the digital feedback signal DG_VFB. The measured ohmic drop margin MIRM can be varied depending on the ohmic drop IRD of the low power supply voltage ELVSS.

The ohmic drop calculator 202 can provide a calculated ohmic drop margin CIRM based on the input image data RGB_DATA. The calculated ohmic drop margin CIRM can be varied depending on an average grayscale of the input image data RGB_DATA.

The second voltage calculator 301 can generate a second target voltage signal DG_TGV2 indicating a second target voltage TGV2 based on the first target voltage signal DG_TGV1, the measured ohmic drop margin MIRM and the calculated ohmic drop margin CIRM. The second target voltage TGV2 can be higher than the first target voltage TGV1 by a smaller margin among the measured ohmic drop margin MIRM and the calculated ohmic drop margin CIRM. The second target voltage TGV2 can be an analog value and the second target voltage signal DG_TGV2 can be a digital value corresponding to the analog value.

The control signal generator 401 can generate the voltage control signal DG_ELVSS based on the second target voltage signal DG_TGV2. As described above, the control signal generator 401 can adjust the voltage control signal DG_ELVSS such that the low power supply voltage ELVSS can follow the second target voltage TGV2, that is, the low power supply voltage ELVSS can be maintained at the second target voltage TGV2.

Figure 15:
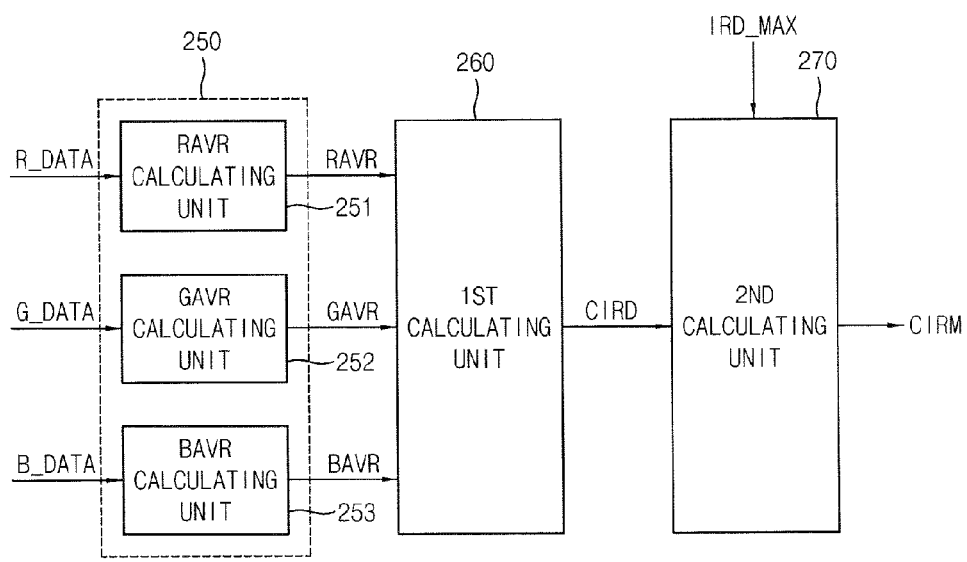
FIG. 15 is a block diagram illustrating an example embodiment of an ohmic drop detector included in the adaptive voltage controller of FIG. 14.

FIG. 15 is a block diagram illustrating an example embodiment of an ohmic drop detector included in the adaptive voltage controller of FIG. 14.

Referring to FIG. 15, an ohmic drop calculator 202 can include an average grayscale calculating unit or average grayscale calculator 250, a first calculating unit or first calculator 260 and a second calculating unit or second calculator 270. The input image data RGB_DATA can include red data R_DATA, green data G_DATA and blue data B_DATA, and the ohmic drop calculator 202 can calculate an average grayscale RAVR of the red data R_DATA, an average grayscale GAVR of the green data G_DATA and an average grayscale BAVR of the blue data B_DATA to determine the calculated ohmic drop margin CIRM.

The average grayscale calculating unit 250 can calculate and provide the average grayscales RAVR, GAVR and BAVR of the red data R_DATA, the green data G_DATA and the blue data B_DATA included in the input image data RGB_DATA. The average grayscale calculating unit 250 can include a red average grayscale calculating unit 251, a green average grayscale calculating unit 252 and a blue average grayscale calculating unit 253. The red average grayscale calculating unit 251 can receive the red data R_DATA sequentially and calculate the average thereof per frame period to provide the red average grayscale RAVR. The green average grayscale calculating unit 252 can receive the green data G_DATA sequentially and calculate the average thereof per frame period to provide the green average grayscale GAVR. The blue average grayscale calculating unit 253 can receive the blue data B_DATA sequentially and calculate the average thereof per frame period to provide the blue average grayscale BAVR.

The first calculating unit 260 can calculate and provide a calculated ohmic drop CIRD based on the average grayscales RAVR, GAVR and BAVR. For example, the first calculating unit 260 provides the calculated ohmic drop CIRD using an equation, CIRD=Kr*RAVR+Kg*GAVR+Kb*BAVR, where Kr, Kg, Kr are proportional constants that are determined based on characteristics of the red pixel, the green pixel and the blue pixel, respectively.

The second calculating unit 270 can calculate and provide the calculated ohmic drop margin CIRM based on a maximum ohmic drop IRD_MAX and the calculated ohmic drop CIRD. The maximum ohmic drop IRD_MAX is the same as described with reference to FIG. 9. For example, the second calculating unit 270 provides the difference between the maximum ohmic drop IRD_MAX and the calculated ohmic drop CIRD as the calculated ohmic drop margin CIRM. As described with reference to FIG. 3, the calculated ohmic drop margin CIRM decreases as the calculated ohmic drop CIRD increases.

Figure 16:
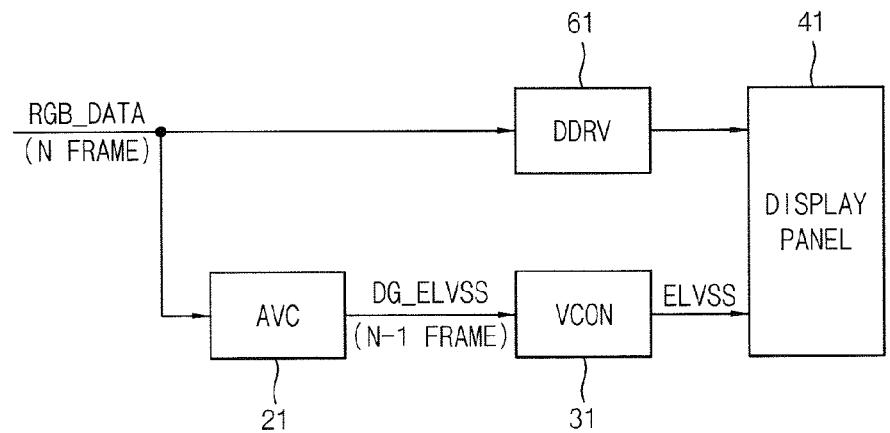
FIGS. 16 and 17 are diagrams illustrating an electroluminescent display of controlling a low power supply voltage by unit of frame according to example embodiments.
Figure 17:
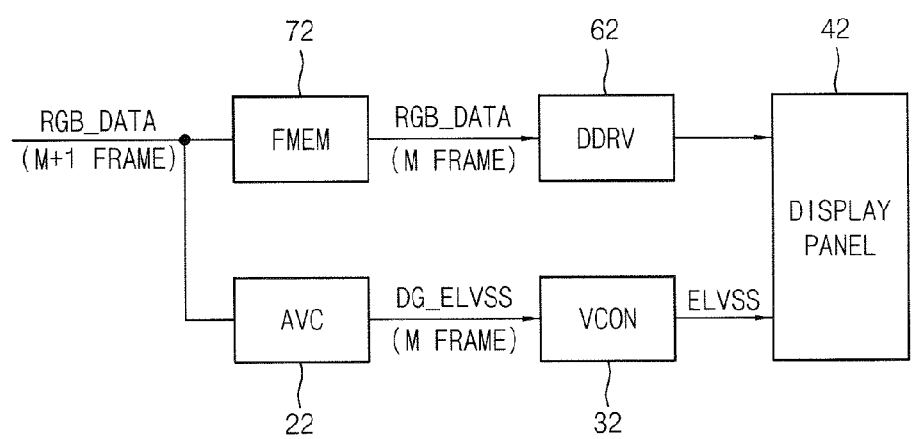

FIGS. 16 and 17 are diagrams illustrating an electroluminescent display of controlling a low power supply voltage by unit of frame according to example embodiments.

Referring to FIG. 16, an electroluminescent display 11 includes an adaptive voltage controller (AVC) 21, a voltage converter VCON 31, a display panel 41 and a data driver DDRV 61

The input image data RGB_DATA can be provides to the data driver 61 by unit of frame in a form of a bit stream and the data driver 61 can drive the display panel 41 in real time based on the received data. For example, the data driver 61 starts to drive the display panel 41 just after the data driver 61 receives the data for one row. In contrast, the adaptive voltage controller 21 can determine the value of the voltage control signal DG_ELVSS after the adaptive voltage controller 21 receives the data for one frame because the adaptive voltage controller 21 calculates the maximum grayscale and/or the average grayscale of the input image data RGB_DATA by unit of frame. Accordingly, the adaptive voltage controller 21 can generate the voltage control signal DG_ELVSS that is determined based on the input image data RGB_DATA of an (N−1)-th frame while the display panel 41 displays an image of the input image data RGB_DATA of an N-th frame where N is an integer equal to or greater than 2.

Referring to FIG. 17, an electroluminescent display 12 includes an AVC 22, a voltage converter VCON 32, a display panel 42, a data driver DDRV 62 and a frame memory FMEM 72.

The frame memory 72 can store the input image data RGB_DATA by unit of frame to provide the buffered data to the data driver after one frame period. For example, the frame memory 72 outputs the input image data RGB_DATA of an M-th frame while the frame memory 72 receives the input image data RGB_DATA of an (M+1)-th frame where M is an integer equal to or greater than 1. Accordingly, the adaptive voltage controller 22 can generate the voltage control signal DG_ELVSS that is determined based on the input image data RGB_DATA of the M-th frame while the display panel 42 displays an image of the input image data RGB_DATA of the M-th frame.

Figure 18:
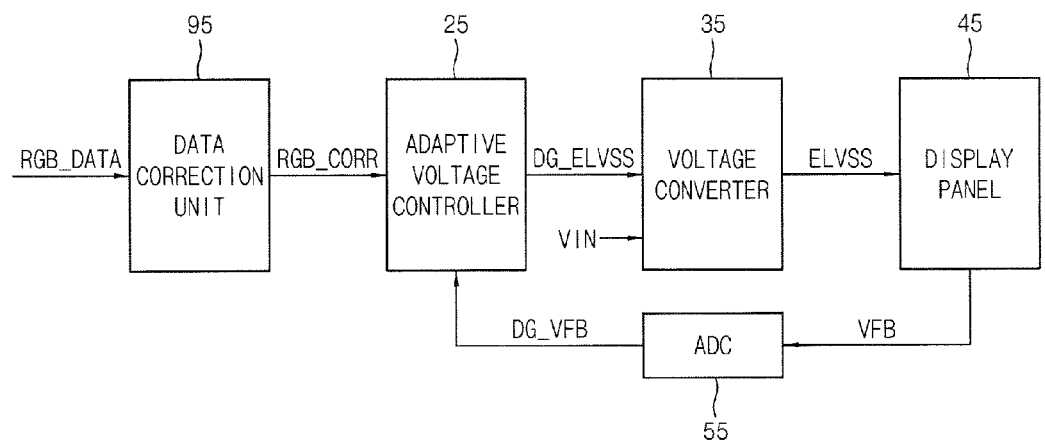
FIG. 18 is a block diagram illustrating an electroluminescent display according to example embodiments.

FIG. 18 is a block diagram illustrating an electroluminescent display according to example embodiments.

Referring to FIG. 18, an electroluminescent display 15 includes a data correction unit or data corrector 95, an adaptive voltage controller 25, a voltage converter 35, a display panel 45 and an ADC 55.

Compared with the electroluminescent display 10 of FIG. 2, the electroluminescent display 15 of FIG. 18 further includes the data correction unit 95 configured to correct grayscales of the input image data RGB_DATA to provide corrected image data RGB_CORR. The adaptive voltage controller 25 can generate the voltage control signal DG_ELVSS based on the corrected image data RGB_CORR instead of the input image data RGB_DATA.

Figure 19A:
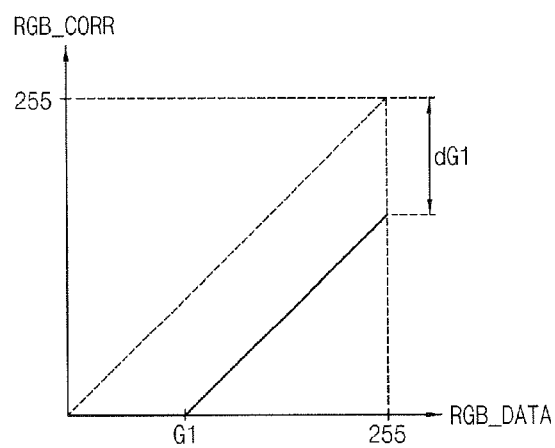
FIGS. 19A and 19B are diagrams for describing examples of correcting data by a data correction unit in the electroluminescent display of FIG. 18.
Figure 19B:
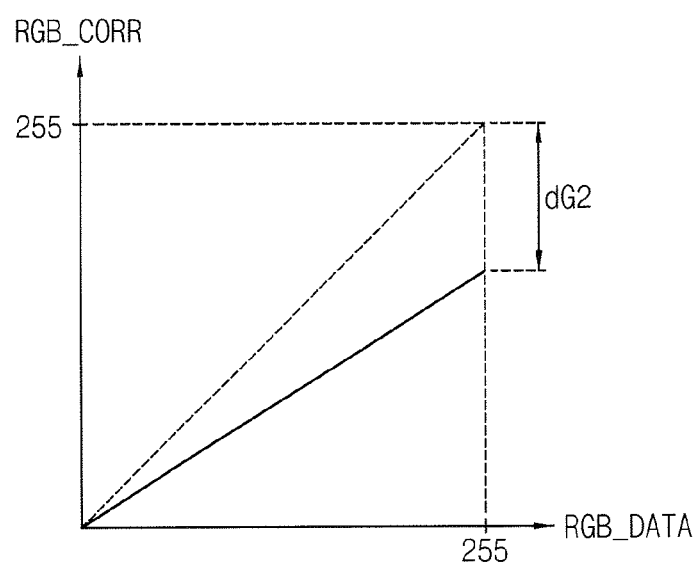

FIGS. 19A and 19B are diagrams for describing examples of correcting data by a data correction unit in the electroluminescent display of FIG. 18.

In FIGS. 19A and 19B, a horizontal axis represents a grayscale of input image data RGB_DATA and a vertical axis represents a grayscale of corrected image data RGB_CORR, where the data RGB_DATA and RGB_CORR are comprised of 8-bit pixel data.

Referring to FIG. 19A, the data correction unit 95 reduces all of the grayscales of the input image data RGB_DATA by a constant value dG1 to provide the corrected image data RGB_DATA. In this case, the grayscales smaller than G1 can be corrected to zero. Referring to FIG. 19B, the data correction unit 95 reduces all of the grayscales of the input image data RGB_DATA by a constant ratio dG2/255 to provide the corrected image data RGB_DATA. Power consumption can be further reduced by correcting the grayscales and controlling the low power supply voltage ELVSS based on the corrected grayscales.

Figure 20:
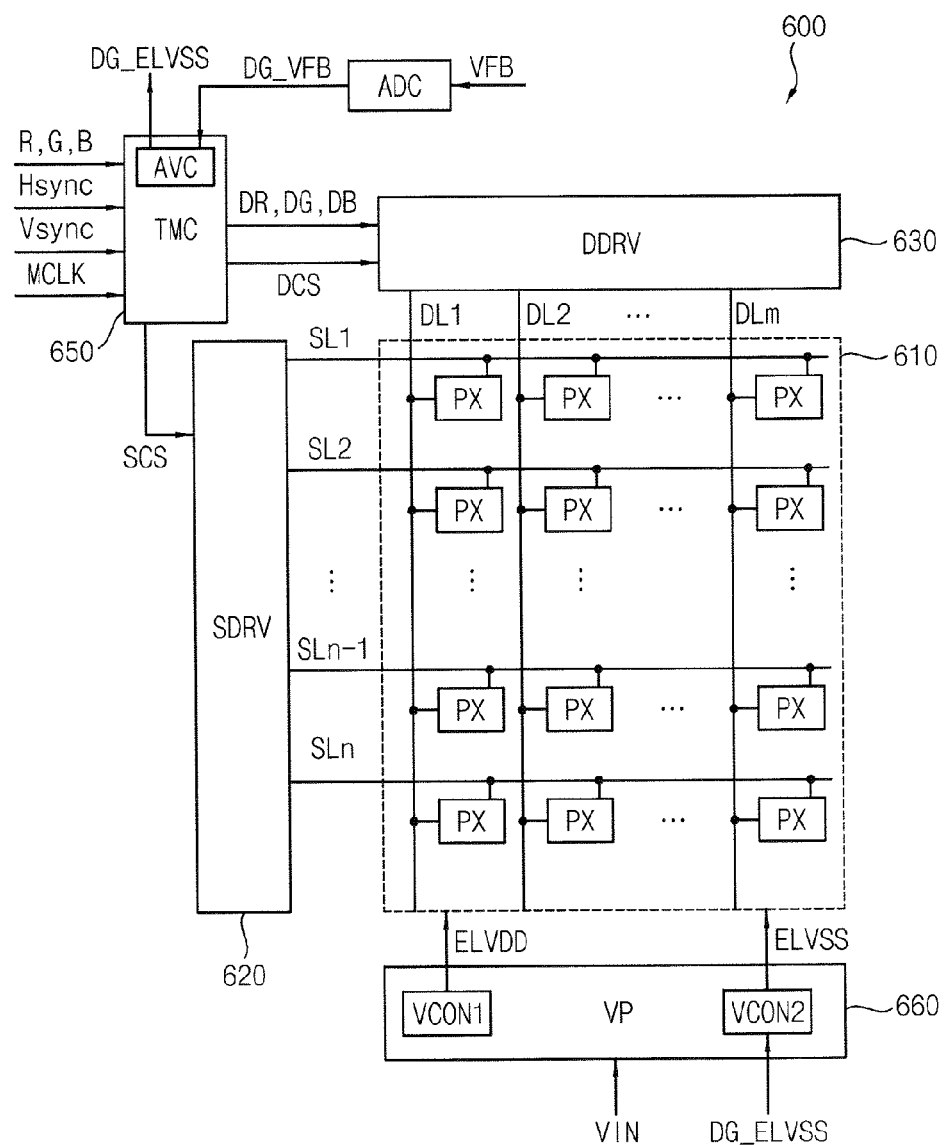
FIG. 20 is a block diagram illustrating an electroluminescent display according to example embodiments.

FIG. 20 is a block diagram illustrating an electroluminescent display according to example embodiments.

A display device 600 or a display module illustrated in FIG. 20 can be an electroluminescent display including a light-emitting diode (LED) or an organic light-emitting diode (OLED) that emits light through the recombination of electrons and holes.

The display device 100 can include a display panel 610 including a plurality of pixel units PX, a scan driver SDRV 620, a data driver DDRV 630, a timing controller TMC 650, a voltage providing circuit VP 660 providing power and voltage signals to the display device 600, an ADC and an adaptive voltage controller (AVC).

The pixels PX can be located (or formed) at crossing regions (e.g., every cross portion) of row control lines (or scan lines) SL1~SLn and data lines DL1~DLm. Each pixel PX can include a plurality of sub pixels. For example, each pixel PX includes a red sub pixel, a green sub pixel, and a blue sub pixel that are arranged along the row direction. In this case, each of the data lines DL1~DLm illustrated in FIG. 20 can include three signal lines for driving the RGB sub pixels, respectively.

The pixels PX can receive the high power supply voltage ELVDD of a positive voltage level and the low power supply voltage ELVSS of a negative voltage level. The scan driver 620 can provide the scan signals SCAN as illustrated in FIG. 6 to the pixels PX by units of rows through the row control lines SL1~SLn. The data driver 630 can provide data signals DATA as illustrated in FIG. 6 to the pixels PX by units of columns through data lines DL1~DLm.

The timing controller 650 can receive and convert image signals R, G, B from an external device and provide converted image data DR, DG, DB to the data driver 630. Also the timing controller 650 can receive a vertical synchronization signal Vsync, a horizontal synchronization signal Hsync, and a clock signal MCLK from the external device and generate control signals for the scan driver 620 and the data driver 630. The timing controller 650 provides scan driving control signals SCS to the scan driver 620 and data driving control signals DCS to the data driver 630, respectively. Each pixel PX emits light by a driving current flowing through the LED or the OLED based on the data signals provided through the data lines DL1~DLm.

The ADC can generate at least one digital feedback signal DG_VFB based on at least one feedback voltage VFB that is provided from the display panel 610 for detecting an ohmic drop IRD of the low power supply voltage ELVSS. In some embodiments, the feedback voltage VFB is one analog voltage sampled at one position of the display panel 610. In other embodiments, the feedback voltage VFB is a plurality of analog voltages sampled at a plurality of position of the display panel 610, respectively. Sampling of the feedback voltage VFB is the same as described with reference to FIG. 8.

The AVC can generate a voltage control signal DG_ELVSS based on input image data RGB_DATA and the digital feedback signal DG_ELVSS such that the voltage control signal DG_ELVSS is varied depending on a distribution of the input image data RGB_DATA and the ohmic drop IRD of the low power supply voltage ELVSS. In some embodiments, the distribution of the input image data RGB_DATA includes a maximum grayscale of the input image data RGB_DATA as described with reference to FIG. 3. In other embodiments, the distribution of the input image data RGB_DATA includes a maximum grayscale and an average grayscale of the input image data RGB_DATA as described with reference to FIG. 14.

The voltage providing circuit 660 can include a first voltage converter VCON1 generating the high power supply voltage ELVDD and a second voltage converter VCON2 generating the low power supply voltage ELVSS. The above-mentioned voltage control signal DG_ELVSS can be provided to the second voltage converter VCON2 and the second voltage converter VCON2 can generate the low power supply voltage ELVSS corresponding to the voltage control signal DG_ELVSS.

As illustrated in FIG. 20, the AVC can be included in the timing controller 650. The AVC can be implemented as software, hardware or a combination of software and hardware. At least a portion of the AVC can be implemented in a form of program codes that are readable by a processor.

Figure 21:
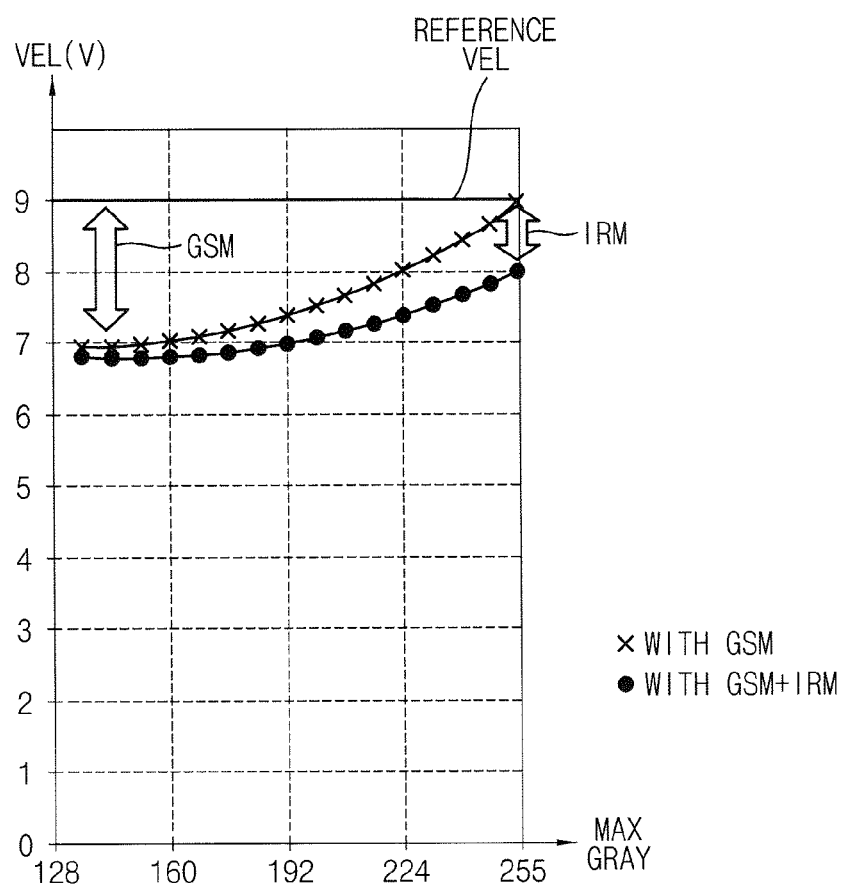
FIG. 21 is a diagram illustrating a change of a driving voltage depending on a maximum grayscale and an ohmic drop.

FIG. 21 is a diagram illustrating a change of a driving voltage depending on a maximum grayscale and an ohmic drop.

In FIG. 21, a horizontal axis represents a maximum grayscale of input image data comprised of 8-bit pixel data, and a vertical axis represents a driving voltage VEL. The driving voltage VEL corresponds to the difference between the high power supply voltage ELVDD and the low power supply voltage ELVSS. The driving voltage by reflecting the grayscale margin GSM is represented by x characters and the driving voltage by reflecting the grayscale margin GSM and the ohmic drop margin IRM is represented by small black circles.

Referring to FIG. 21, the driving voltage with the grayscale margin GSM is lower than the reference driving voltage (e.g., about 9V) by the grayscale margin GSM, and the driving voltage with the grayscale margin GSM and the ohmic drop margin IRM is lower than the reference driving voltage by the sum of the grayscale margin GSM and the ohmic drop margin IRM. As illustrated in FIG. 21, the grayscale margin GSM decreases as the maximum grayscale of the input image data RGB_DATA increases. In addition, the ohmic drop margin IRM can decrease as the ohmic drop IRD of the low power supply voltage ELVSS increases.

The power supply voltage can be controlled to reduce power consumption by analyzing brightness of a displayed image. However, the display quality recognized by a user can be degraded because the brightness ratio and the driving current do not coincide with the respective colors, if the power supply voltage is controlled based on only the image brightness analysis. In addition, a sufficient driving voltage has to be secured because it is difficult to predict a precise ohmic drop depending on the image, and thus the effect of reducing power consumption is relieved. In some embodiments, power consumption is reduced while suppressing degradation of display quality, by reflecting the ohmic drop margin IRM in addition to the grayscale margin GSM.

Figure 22:
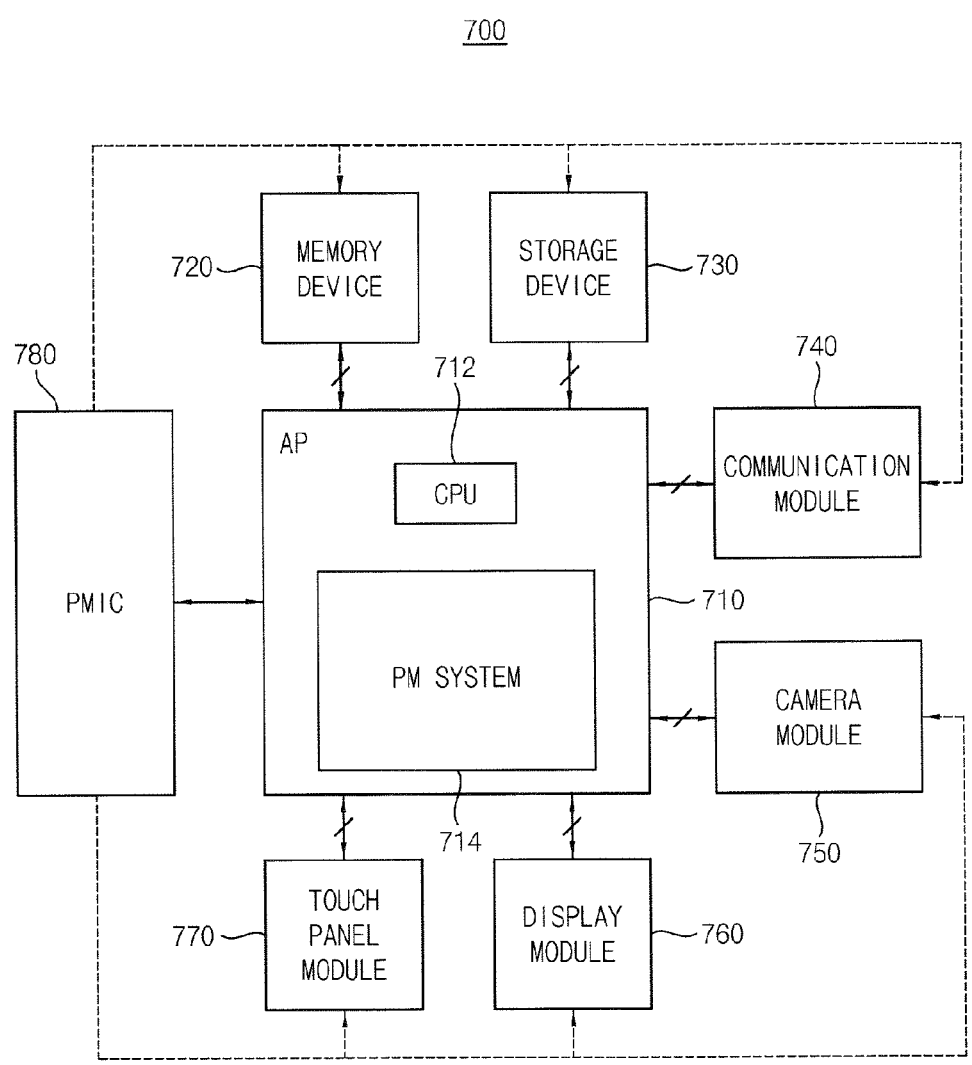
FIG. 22 is a block diagram illustrating a mobile device according to example embodiments.

FIG. 22 is a block diagram illustrating a mobile device according to example embodiments.

Referring to FIG. 22, a mobile device 700 includes a system on chip 710 and a plurality of functional modules 740, 750, 760, and 770. The mobile device 700 can further include a memory device 720, a storage device 730, and a power management integrated circuit (PMIC) 780.

The system on chip 710 controls overall operations of the mobile device 700. The system on chip 710 can control the memory device 720, the storage device 730, and the functional modules 740, 750, 760, and 770. For example, the system on chip 710 is an application processor (AP). The system on chip 710 can include a CPU core 711 and a power management (PM) system 714.

The memory device 720 and the storage device 730 can store data for operations of the mobile device 700. The memory device 720 can correspond to a volatile semiconductor memory device such as a dynamic random access memory (DRAM) device, a static random access memory (SRAM) device, a mobile DRAM, etc. In addition, the storage device 730 can correspond to a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. In some embodiments, the storage device 730 corresponds to a solid state drive (SSD) device, a hard disk drive (HDD) device, a CD-ROM device, etc.

The functional modules 740, 750, 760, and 770 perform various functions of the mobile device 700. For example, the mobile device 700 comprises a communication module 740 that performs a communication function (e.g., a code division multiple access (CDMA) module, a long term evolution (LTE) module, a radio frequency (RF) module, an ultra wideband (UWB) module, a wireless local area network (WLAN) module, a worldwide interoperability for a microwave access (WIMAX) module, etc.), a camera module 750 that performs a camera function, a display module 760 that performs a display function, a touch panel module 770 that performs a touch sensing function, etc. In some embodiments, the mobile device 700 further includes a global positioning system (GPS) module, a microphone (MIC) module, a speaker module, a gyroscope module, etc. However, the types or kinds of the functional modules 740, 750, 760, and 770 in the mobile device 700 are not limited thereto.

The PMIC 780 can provide driving voltages to the system on chip 710, the memory device 720, and the functional modules 740, 750, 760, and 770, respectively.

In some embodiments, the display module 760 includes an ADC and an AVC as described above. The ADC can generate at least one digital feedback signal DG_VFB based on at least one feedback voltage VFB that is provided from the display panel for detecting an ohmic drop IRD of the low power supply voltage ELVSS. The AVC can generate a voltage control signal DG_ELVSS based on input image data RGB_DATA and the digital feedback signal DG_ELVSS such that the voltage control signal DG_ELVSS is varied depending on a distribution of the input image data RGB_DATA and the ohmic drop IRD of the low power supply voltage ELVSS. In some embodiments, power consumption is reduced while suppressing degradation of display quality, by detecting the ohmic drop of the low power supply voltage using the feedback voltage and controlling the low power supply voltage based on the detected ohmic drop.

Figure 23:
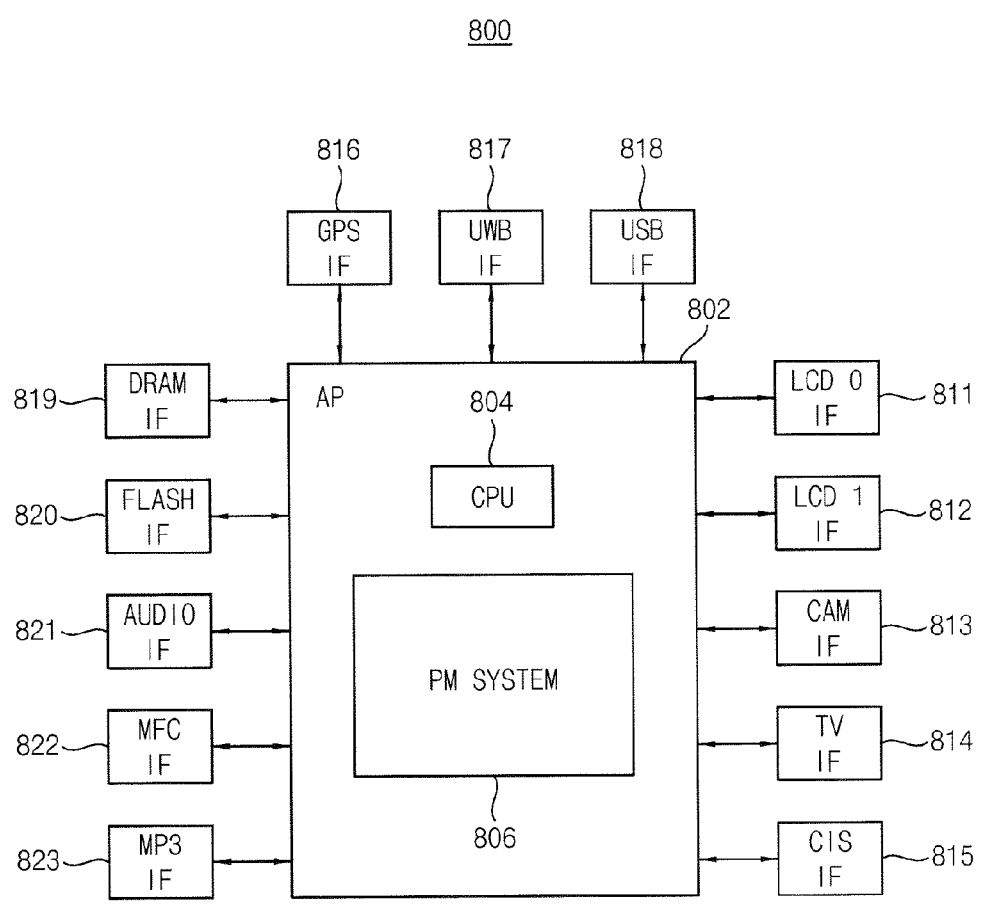
FIG. 23 is a block diagram illustrating a mobile device adopting an example interface according to example embodiments.

FIG. 23 is a block diagram illustrating a mobile device adopting an example interface according to example embodiments.

Referring to FIG. 23, a mobile device 800 includes a system on chip 802 and a plurality of interfaces 811, 812, 813, 814, 815, 816, 817, 818, 819, 820, 821, 822, and 823. In some embodiments, the mobile device 800 is a mobile phone, a smartphone, a personal digital assistant (PDA), a portable multimedia player (PMP), a digital camera, a music player, a portable game console, a navigation system, etc.

The system on chip 802 controls overall operations of the mobile device 800. The system on chip 802 can be an application processor (AP). The system on chip 802 can include a CPU core 804 and a power management (PM) system 806.

The system on chip 802 can communicate with each of a plurality of peripheral devices through each of the interfaces 811 to 823. For example, each interface 811 to 823 can transmit at least one control signal, which is output from a corresponding intellectual property (IP) among a plurality of IPs embodied in each of power domains, to each of the plurality of peripheral devices.

For example, the system on chip 802 controls a power state and an operation state of each display device through each display interface 811 and 812. The display device can be a liquid crystal display (LCD), a light-emitting diode (LED) display, an OLED display or an active matrix organic light-emitting diode (AMOLED) display.

The system on chip 802 can control a power state and an operation state of a camcorder through a camcorder interface 813, control a power state and an operation state of a TV module through a TV interface 814, and control a power state and an operation state of a camera module or an image sensor module through an image sensor interface 815.

The system on chip 802 can control a power state and an operation state of a GPS module through a GPS interface 816, control a power state and an operation state of an ultra wideband (UWB) module through a UWB interface 817, and control a power state and an operation state of a USB drive through a USB drive interface 818.

The system on chip 802 can control a power state and an operation state of a dynamic random access memory (DRAM) through a DRAM interface 819, control a power state and an operation state of a non-volatile memory device, e.g., a flash memory, through a non-volatile memory interface 820, e.g., a flash memory interface, control a power state and an operation state of an audio module through an audio interface 821, control a power state of a multi-format codec (MFC) through an MFC interface 822, and control a power state of an MP3 player through an MP3 player interface 823. Here, a module or an interface can be embodied in hardware or software.

Figure 24:
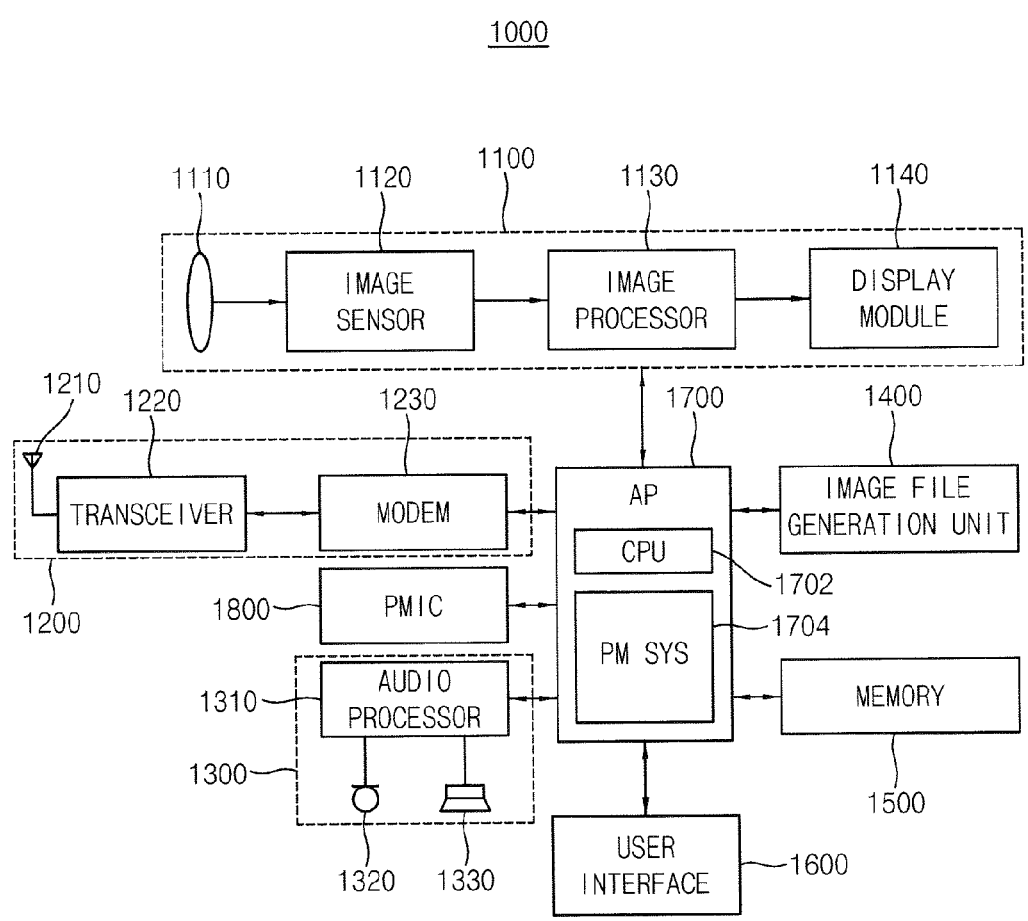
FIG. 24 is a block diagram illustrating a portable terminal according to example embodiments.

FIG. 24 is a block diagram illustrating a portable terminal according to example embodiments.

Referring to FIG. 24, a portable terminal 1000 includes an image processing block or image processor 1100, a wireless transceiving block or wireless transceiver 1200, an audio processing block or audio processor 1300, an image file generation unit or image file generator 1400, a memory device 1500, a user interface 1600, an application processor 1700, and a power management integrated circuit (PMIC) 1800.

The image processing block 1100 includes a lens 1110, an image sensor 1120, an image processor 1130, and a display module 1140. The wireless transceiving block 1200 includes an antenna 1210, a transceiver 1220, and a modem 1230. The audio processing block 1300 includes an audio processor 1310, a microphone 1320, and a speaker 1330.

In some embodiments, the display module 1140 includes an ADC and an AVC as described above. The ADC can generate at least one digital feedback signal DG_VFB based on at least one feedback voltage VFB that is provided from the display panel for detecting an ohmic drop IRD of the low power supply voltage ELVSS. The AVC can generate a voltage control signal DG_ELVSS based on input image data RGB_DATA and the digital feedback signal DG_ELVSS such that the voltage control signal DG_ELVSS is varied depending on a distribution of the input image data RGB_DATA and the ohmic drop IRD of the low power supply voltage ELVSS. In some embodiments, power consumption is reduced while suppressing degradation of display quality, by detecting the ohmic drop of the low power supply voltage using the feedback voltage and controlling the low power supply voltage based on the detected ohmic drop.

The portable terminal 1000 can include various kinds of semiconductor devices. The application processor 1700 exhibits low power consumption and high performance. The application processor 1700 can have multiple cores as a manufacturing process has become minutely detailed. The application processor 1700 can include a CPU core 1702 and a power management (PM) system 1704.

The PMIC 1800 can provide driving voltages to the image processing block 1100, the wireless transceiving block 1200, the audio processing block 1300, the image file generation unit 1400, the memory device 1500, the user interface 1600, and the application processor 1700, respectively.

The above described embodiments can be applied to various kinds of devices and systems such as mobile phone, smartphones, tablet computers, laptop computers, personal digital assistants (PDAs), portable multimedia players (PMP), digital televisions, digital cameras, portable game consoles, music players, camcorders, video players, navigation systems, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the inventive technology as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and equivalents thereof.

What is claimed is:

1. An electroluminescent display comprising:
  a display panel including a plurality of pixels configured to operate based on a first power supply voltage having a negative voltage level, wherein the display panel is configured to generate at least one feedback voltage corresponding to an ohmic drop of the first power supply voltage;
  an analog-to-digital converter configured to generate at least one digital feedback signal based on the at least one feedback voltage;
  an adaptive voltage controller configured to generate a voltage control signal based on input image data, the at least one digital feedback signal, a distribution of the input image data and the ohmic drop of the first power supply voltage; and
a voltage converter configured to generate the first power supply voltage based on an input voltage and the voltage control signal.

2. The electroluminescent display of claim 1, wherein the adaptive voltage controller is further configured to adjust the voltage control signal so as to maintain the first power supply voltage at a target voltage, wherein the target voltage is greater than a reference voltage by the sum of a grayscale margin and an ohmic drop margin, and wherein the adaptive voltage controller is further configured to determine the grayscale margin based on a maximum grayscale of the input image data, and wherein the adaptive voltage controller is further configured to generate the ohmic drop margin based on the ohmic drop of the first power supply voltage.

3. The electroluminescent display of claim 2, wherein adaptive voltage controller is further configured to decrease the grayscale margin as the maximum grayscale of the input image data increases.

4. The electroluminescent display of claim 2, wherein the adaptive voltage controller is further configured to decrease the ohmic drop margin as the ohmic drop of the first power supply voltage increases.

5. The electroluminescent display of claim 1, further comprising a plurality of conduction lines electrically connected to a plurality of detection points, respectively, wherein the conduction lines are formed over a cathode electrode included in the display panel, wherein the display panel is further configured to transmit the at least one feedback voltage including a plurality of feedback voltages, of the at least one feedback voltage, to the analog-to digital converter through the conduction lines.

6. The electroluminescent display of claim 5, wherein the ohmic drop of the first power supply voltage corresponds to the difference between a maximum feedback voltage of the feedback voltages and the first power supply voltage.

7. The electroluminescent display of claim 1, wherein the adaptive voltage controller includes:
a first voltage calculator configured to generate a first target voltage signal corresponding to a first target voltage based on the input image data and a maximum grayscale of the input image data;
an ohmic drop detector configured to provide a measured ohmic drop margin based on the digital feedback signal and the ohmic drop of the first power supply voltage;
a second voltage calculator configured to generate a second target voltage signal corresponding to a second target voltage based on the first target voltage signal and the measured ohmic drop margin, wherein the second target voltage is greater than the first target voltage by the measured ohmic drop margin; and
a control signal generator configured to generate the voltage control signal based on the second target voltage signal.

8. The electroluminescent display of claim 7, wherein the input image data includes red data, green data and blue data, and
wherein the first voltage calculator is further configured to extract a maximum grayscale of the red data, a maximum grayscale of the green data and a maximum grayscale of the blue data so as to determine the first target voltage.

9. The electroluminescent display of claim 7, wherein the at least one feedback voltage comprises a plurality of feedback voltages that include a maximum feedback voltage, and wherein the ohmic drop detector includes:
a maximum feedback voltage extractor configured to extract and provide a maximum feedback voltage based on a plurality of digital feedback signals respectively corresponding to the feedback voltages;
a first calculator configured to provide a measured ohmic drop based on the maximum feedback voltage and the voltage control signal;
a second calculator configured to provide a maximum ohmic drop based on the first target voltage signal; and
a third calculator configured to provide the measured ohmic drop margin based on the measured ohmic drop and the maximum ohmic drop.

10. The electroluminescent display of claim 9, wherein the measured ohmic drop margin corresponds to the difference between the maximum ohmic drop and the measured ohmic drop.

11. The electroluminescent display of claim 7, wherein the adaptive voltage controller is further configured to adjust the voltage control signal so as to i) decrease the first power supply voltage substantially stepwise by a first voltage interval per frame period when the first power supply voltage is greater than the second target voltage and ii) increase the first power supply voltage substantially stepwise by a second voltage interval per frame period when the first power supply voltage is less than the second target voltage.

12. The electroluminescent display of claim 11, wherein the first voltage interval is greater than the second voltage interval.

13. The electroluminescent display of claim 1, wherein the adaptive voltage controller includes:
a first voltage calculator configured to generate a first target voltage signal corresponding to a first target voltage based on the input image data and a maximum grayscale of the input image data;
an ohmic drop detector configured to provide a measured ohmic drop margin based on the digital feedback signal and the ohmic drop of the first power supply voltage;
an ohmic drop calculator configured to provide a calculated ohmic drop margin based on the input image data and an average grayscale of the input image data;
a second voltage calculator configured to generate a second target voltage signal corresponding to a second target voltage based on the first target voltage signal, the measured ohmic drop margin and the calculated ohmic drop margin, wherein the second target voltage is greater than the first target voltage by a smaller value of the measured ohmic drop margin and the calculated ohmic drop margin; and
a control signal generator configured to generate the voltage control signal based on the second target voltage signal.

14. The electroluminescent display of claim 13, wherein the ohmic drop calculator includes:
an average grayscale calculator configured to provide average grayscales of red data, green data and blue data included in the input image data;
a first calculator configured to provide a calculated ohmic drop based on the average grayscales; and
a second calculator configured to provide the calculated ohmic drop margin based on a maximum ohmic drop and the calculated ohmic drop.

15. The electroluminescent display of claim 14, wherein the calculated ohmic drop margin corresponds to the difference between the maximum ohmic drop and the calculated ohmic drop.

16. The electroluminescent display of claim 1, wherein the input image data is in units of frames, and
wherein the adaptive voltage controller is further configured to generate the voltage control signal based on the input image data of an (N−1)-th frame while the display panel displays an image of the input image data of an N-th frame, where N is an integer equal to or greater than 2.

17. The electroluminescent display of claim 1, further comprising a frame memory configured to store the input image data in units of frames,
wherein the input image data is in units of frames, and
wherein the adaptive voltage controller is further configured to generate the voltage control signal based on the input image data of an M-th frame while the display panel displays an image of the input image data of the M-th frame, where M is an integer equal to or greater than 1.

18. The electroluminescent display of claim 1, further comprising a data corrector configured to correct grayscales of the input image data so as to provide corrected image data, wherein the adaptive voltage controller is further configured to generate the voltage control signal based on the corrected image data instead of the input image data.

19. A method of driving an electroluminescent display, comprising:
providing at least one feedback voltage configured to detect an ohmic drop of a first power supply voltage having a negative voltage level from a display panel, wherein the display panel includes a plurality of pixels configured to operate based on the first power supply voltage;
generating a digital feedback signal based on the at least one feedback voltage;
generating a voltage control signal based on input image data, the digital feedback signal, wherein the voltage control signal varies depending on a distribution of the input image data and the ohmic drop of the first power supply voltage; and
generating the first power supply voltage based on an input voltage and the voltage control signal.

20. The method of claim 19, wherein generating the voltage control signal includes:
generating a first target voltage signal corresponding to a first target voltage based on the input image data and a maximum grayscale of the input image data;
providing a measured ohmic drop margin based on the digital feedback signal and the ohmic drop of the first power supply voltage;
generating a second target voltage signal corresponding to a second target voltage based on the first target voltage signal and the measured ohmic drop margin, wherein the second target voltage is greater than the first target voltage by the measured ohmic drop margin; and
generating the voltage control signal based on the second target voltage signal.

\* \* \* \* \*